United States Patent
Berens

(10) Patent No.: US 7,836,376 B2
(45) Date of Patent: Nov. 16, 2010

(54) METHOD AND APPARATUS FOR ENCODING BLOCKS OF DATA WITH A BLOCKS ORIENTED CODE AND FOR DECODING SUCH BLOCKS WITH A CONTROLLABLE LATENCY DECODING, IN PARTICULAR FOR A WIRELESS COMMUNICATION SYSTEM OF THE WLAN OR WPAN TYPE

(75) Inventor: Friedbert Berens, Geneva (CH)

(73) Assignee: STMicroelectronics N.V., Amsterdam (NL)

( * ) Notice: Subject to any disclaimer, the term of this patent is extended or adjusted under 35 U.S.C. 154(b) by 1035 days.

(21) Appl. No.: 11/559,632

(22) Filed: Nov. 14, 2006

(65) Prior Publication Data

US 2007/0139229 A1 Jun. 21, 2007

(30) Foreign Application Priority Data

Nov. 15, 2005 (EP) .................................. 05024884

(51) Int. Cl.
*G11C 29/00* (2006.01)

(52) U.S. Cl. ................... 714/763; 714/768; 714/758

(58) Field of Classification Search ............... 714/763, 714/764, 768, 752, 753, 758
See application file for complete search history.

(56) References Cited

U.S. PATENT DOCUMENTS

| 7,149,362 | B2 * | 12/2006 | Lafruit et al. ............... 382/240 |
| 7,266,757 | B1 * | 9/2007 | Mazahreh et al. ........... 714/794 |
| 2002/0194555 | A1 | 12/2002 | Gueguen ..................... 714/704 |
| 2003/0110286 | A1 | 6/2003 | Antal et al. ................. 709/236 |
| 2003/0126551 | A1 | 7/2003 | Mantha et al. .............. 714/790 |
| 2004/0052144 | A1 | 3/2004 | Berens et al. ............... 365/221 |

FOREIGN PATENT DOCUMENTS

| EP | 0827312 | 3/1998 |
| EP | 1337063 | 8/2003 |
| EP | 1526701 | 4/2005 |
| WO | 99/44341 | 9/1999 |

OTHER PUBLICATIONS

Patent Abstracts of Japan, vol. 1999, No. 07, Mar. 31, 1999 and JP 09186612, Internatl Business Mach Corp, Jul. 15, 1997.
Dobkin et al., Parallel VLSI Architecture for Map Turbo Decoder, Personal, Indoor and Mobile Radio Communications, 2002, 13th IEEE International Symposium on Sep. 15, 18, 2002, pp. 384-388.

* cited by examiner

*Primary Examiner*—Scott T Baderman
*Assistant Examiner*—Fritz Alphonse
(74) *Attorney, Agent, or Firm*—Lisa K. Jorgenson; Allen, Dyer, Doppelt, Milbrath & Gilchrist, P.A.

(57) ABSTRACT

To control a decoding latency, larger blocks are nonequally segmented into smaller ones. The decoding process starts directly after reception of the first small block. The latency is defined by the latency of the last small block decoding. Changing the number of iterations during the turbo-code decoding also permits control of the decoding latency.

29 Claims, 18 Drawing Sheets

METHOD AND APPARATUS FOR ENCODING BLOCKS OF DATA WITH A BLOCKS ORIENTED CODE AND FOR DECODING SUCH BLOCKS WITH A CONTROLLABLE LATENCY DECODING, IN PARTICULAR FOR A WIRELESS COMMUNICATION SYSTEM OF THE WLAN OR WPAN TYPE

FIELD OF THE INVENTION

The invention relates in general to channel coding and decoding techniques, and in particular, to blocks oriented codes, such as turbo-codes or LDPC codes, for example.

BACKGROUND OF THE INVENTION

Channel coding is a very important component in wireless communication systems like UMTS, WLAN (Wireless Local Area Network) and WPAN (Wireless Personal Area Network). In packet based transmission systems like WLAN and WPAN, as well as mobile radio systems (UMTS, HSDPA), the latency of the used channel decoder is of major importance. The latency of a decoder, or the decoding latency, is the time between the reception of the last bit of a block to be decoded and the output of the first result bit, i.e., after decoding.

In mobile radio, the reduction of latency can simplify the implementation complexity and the packet operation of the systems. In WLAN or WPAN systems, latency is an important parameter which has to be taken into account to ensure the functionality of the higher layers (MAC layer and above) and the efficient use of the spectrum resource by reducing the idle times.

FIG. 1 illustrates a stop-and-wait protocol in IEEE 802.11 WLAN systems, which is an error free case. More precisely, a typical situation in an 802.11 type of protocol based on CSMA-CA multiple access method is depicted. The source TX is sending a data block of length N at position 1. The destination RX receives the data block after the transmission delay at position 2. After the end of the data block reception at position 3, the TX destination sends out an acknowledgement ACK at position 4. This acknowledgement signal needs to be received by the RX source after an SIFS interval (Short Inter-Frame Space) at position 5. In the 802.11a standard this SIFS interval is equal to 16 microseconds.

In a block based channel decoder, the decoding process can only start after the reception of the last bit in the block. Thus, the decoder needs to be very much overdimensioned in order to fulfill the timing requirements given by the standard. Thus, the channel coding of choice are convolutional coding schemes, which can already start the decoding with the first received bit. In this case, the available decoding time is much longer than in a block code case, especially when only small or no channel interleaving schemes are used.

Turbo-codes are other types of coding schemes which offer very good performance. However, due to the iterative structure of the decoder, the decoding latency is greater than the decoding latency of a convolutional code. Further, in case of turbo codes, larger blocks are better for the performance and the throughput, but lead to a higher latency.

For all these reasons, the latency problem of the turbo code decoder has generally prevented the use of this class of channel codes in the packet domain like the WLAN standard 802.11a/b/g. Consequently, in existing systems using packet transmission, either no coding or convolutional coders are generally used.

U.S. published patent application no. 2002/0194555A1 teaches that a reduction in the latency time can be obtained by reducing the size of the block at the cost of a correlative reduction in the performance of the system. European patent no. 1,337,063 teaches an analysis of a quality of service (QoS) for performing an equal segmentation of a frame to be turbo-code encoded to obtain an optimal length of the sub-frames.

However, as indicated above, such a length reduction is not compatible with good performance and throughput for turbo codes, but also more generally for blocks oriented codes, including also Low Density Parity Check codes (LDPC codes), for example.

SUMMARY OF THE INVENTION

An object of the invention is to reduce the latency of a blocks oriented code decoder, such as a turbo-code decoder, for example, in order to adapt it to the actual needs of a specific application while maintaining good decoding and communication performance.

Another object of the invention is to permit the use of turbo code in the field of packet based transmission systems, like WLAN and WPAN systems, or in Digital Subscriber Line systems, like ADSL, VDSL or more generally xDSL, while controlling the turbo-code decoding latency and maintaining the performance needs.

According to one aspect, a method of encoding blocks of data with a blocks oriented code is provided. For example, depending on the application and/or the kind of data (control data, application data . . . ), the size of the block of data can be different and/or the required decoding latency can be different.

The method comprises receiving a block of data to be encoded, and a) if the size of the block is consistent with a desired decoding latency, encoding the block of data, and b) if the size of the block is not consistent with the desired turbo-code decoding latency, then nonequally splitting the block of data in a set of several sub-blocks to be sequentially and successively encoded with the blocks oriented code. The last sub-block to be encoded has a last sub-block size consistent with a decoding latency equal to or being the closest to the desired decoding latency and at least another sub-block having the greatest sub-block size. The greatest sub-block size is consistent with a given turbo-code decoding speed.

The method further comprises sequentially and successively encoding the sub-blocks of the set.

According to another aspect, a method of decoding a received block of data encoded with a blocks oriented code is provided. The method comprises receiving a control information indicating whether or not the received encoded block of data comprises a sequence of several encoded sub-blocks in which the last sub-block to be decoded has a chosen sub-block size consistent with a decoding latency equal to or being the closest to a desired decoding latency and at least another sub-block has the greatest sub-block size.

Depending on the control information, the method may comprise decoding the block of data as a whole, or sequentially and successively decoding the encoded sub-blocks. The decoding of each encoded sub-block begins at the end of the reception of the encoded sub-block.

In other words, if for example the length of the block of data to be encoded leads to a latency decoding which is consistent with the needs of the application, or if the data contained in the block of data are latency non-restricted data, then the block of data is encoded without any preprocessing.

However, if for example the data of the block are latency-restricted data and if the decoding of the block of data would lead to latency which is not consistent with the needs of the application, for example with the duration of the SIFS interval, a preprocessing is applied to the block of data. More precisely, such a large block is nonequally segmented into smaller sub-blocks. The latency is for example defined by the latency of the last block decoding. The larger sub-blocks permit one to maintain good performance decoding and are also better for the overall throughput, provided of course that the decoder can decode the blocks fast enough, so that at the end of the reception of sub-block N+1, sub-block N is decoded and the decoder is available. Accordingly, the greatest size of sub-block of the set of sub-blocks needs to be consistent with the decoding speed of the decoder. Consequently, with the nonequal segmentation according to these aspects of the invention, the latency can be controlled and satisfy the requirement of the specific application, whereas good communication performance are maintained.

In a typical case of a turbo-code a broad range of blocks sizes are defined. For example in the UMTS systems blocks sizes of 40 to 5114 bits with a one bit resolution are defined. Thus, it is generally possible to choose the size of the last sub-block in order to have a decoding latency equal to the desired latency.

However, the method is not limited to turbo-code, and the use of other blocks oriented codes is possible. For example codes like LUPC codes, BCH codes, Reed-Solomon codes, Reed-Muller codes, etc. can be used.

For LDPC codes the possible block sizes which can be used are given by the used architecture. Preferably, for a given efficient architecture only a limited set of sizes can be easily implemented. For example, in the case of WIMAX (IEEE 80.216e standard) 19 different block sizes are defined. For DVB-S2 LDPC codes, 9 different block sizes are defined.

In the turbo code case it is also possible to restrict the block sizes to a limited set (as for example around 20 different sizes for CDMA 2000). Thus, depending on the type of blocks oriented code used and/or the type of application or standard, the sizes of the sub-blocks may be chosen within a set of predefined sizes.

In such a case, if it is not possible to choose among the set of predefined sizes, a size of the last sub-block leading to the desired latency, the sub-block size of the last sub-block is chosen in the set to be consistent with a decoding latency which is the closest to the desired latency.

It is not mandatory for the largest sub-block to be the first sub-block to be encoded and decoded. For example, the first sub-block of the set can be a small control block.

Further, the set of sub-blocks could comprise large sub-blocks each having the same largest size followed by a last sub-block of a smaller size for being consistent with a latency equal to or being the closest to a desired latency. However, a simple way for implementing the nonequal splitting is obtained with sizes of the sub-blocks decreasing from the first sub-block to be encoded to the last sub-block to be encoded.

Preferably, the set of sub-blocks comprises a sub-set of sub-blocks in which the respective sizes of the sub-blocks decrease monotonically from the first sub-block of the sub-set to be encoded to the last sub-block of the sub-set to be encoded. The first sub-block of the sub-set has the greatest size. The size of a current sub-block of the sub-set being is half of the size of the preceding sub-block of the sub-set.

According to one embodiment in which the blocks oriented code is turbo code the encoding method further comprises a) adapting the interleaving pattern associated to the turbo-code encoding to the size of the block, if the size of the block is consistent with a desired turbo-code decoding latency, and b) respectively adapting the interleaving pattern associated to the turbo-code encoding to the size of the successive sub-blocks, if the size of the block is not consistent with the desired turbo-code decoding latency.

According to another embodiment still related to turbo-code, the decoding method further comprises depending on the control information, turbo-code decoding the block of data as a whole while adapting the interleaving and de-interleaving pattern associated to the turbo-code decoding to the size of the received block, or sequentially and successively turbo-code decoding the encoded sub-blocks while respectively adapting the interleaving and de-interleaving pattern associated to the turbo-code decoding to the size of the successive sub-blocks.

In other words, if for example the length of the block of data to be encoded leads to a latency decoding which is consistent with the needs of the application, or if the data contained in the block of data are latency non-restricted data, the block of data is turbo encoded without any preprocessing, while the interleaving and de-interleaving patterns of the turbo encoding means and turbo decoding means are adapted to the actual length of the block of data.

Another important feature of these embodiments includes adapting the interleaving and de-interleaving patterns associated to the turbo-code encoding and turbo-code decoding to the size of each sub-block resulting from the nonequal segmentation of the block.

The control of the turbo decoding latency may further comprise an adaptation of the number of iterations performed during turbo-code decoding. When the block of data to be encoded comprises an initial CRC word, in case b) above, a CRC word is calculated from the data decoded in all the sub-blocks and the calculated CRC word is compared with the initial CRC word after having decoded the last encoded sub-block.

In a particular but non-limiting application, the encoded blocks of data are transmitted through a wireless data communication system of the WPAN or WLAN type, or through a wireless data communication system like an UMTS mobile radio system.

According to another aspect, an apparatus adapted to encode blocks of data with a blocks oriented code comprises an encoding device having a main input adapted to receive a block of data to be encoded, and a splitter having a splitter input, and a splitter output. The splitter is adapted to split a block of data into a set of sub-blocks in which the last sub-block to be encoded has a last sub-block size consistent with a decoding latency equal to or being the closest to a desired decoding latency and at least another sub-block has the greatest sub-block size. The greatest sub-block size is consistent with a given decoding speed. The splitter output is adapted to sequentially deliver the sub-blocks.

A blocks oriented code encoder has an encoder data input, encoding means, and an encoder control input adapted to receive an information representative of the size of the block of data to be encoded. Global control means are adapted to receive control information and to either couple the splitter input to the main input and the encoder data input to the splitter output, or couple the encoder data input to the main input, depending on the control information.

The sizes of the sub-blocks may decrease from the first sub-block to be encoded to the last sub-block to be encoded.

Preferably, the set of sub-blocks comprises a sub-set of sub-blocks in which the respective sizes of the sub-blocks decrease monotonically from the first sub-block of the sub-set to be encoded to the last sub-block of the sub-set to be encoded. The first sub-block of the sub-set has the greatest size, and the size of a current sub-block of the sub-set is half of the size of the preceding sub-block of the sub-set.

According to an embodiment directed to a turbo code, the encoding means are flexible turbo-code encoding means, and the apparatus further comprises internal control means for adapting the turbo-code encoding means to the size information.

The blocks oriented code may be an LDPC code. The sizes of the sub-blocks may belong to a set of predefined sizes.

According to another aspect, an apparatus adapted to decode blocks of data encoded with a blocks oriented code comprises a decoding device having an adaptable latency. The decoding device comprises an input for receiving encoded blocks of data, decoding means, a control input adapted to receive a control information indicating whether or not a received block of data is nonequally split into a set of sub-blocks a n d an information representative of the size of the encoded block of data or of the size of each sub-block of the set. The decoding means is adapted, depending on the control information, to decode the block of data as a whole, or sequentially and successively decode the encoded sub-blocks. The decoding of each encoded sub-block begins at the end of the reception of the encoded sub-block.

The blocks oriented code may be an LDPC code.

According to an embodiment in which the blocks oriented code is a turbo code, the decoding device is a flexible turbo-code decoding device having an adaptable latency. The decoding means are flexible turbo-code decoding means, and the flexible turbo-code decoding device further comprise internal control means for adapting the turbo-code decoding means to the size information.

The fact that the turbo-code encoding device and the turbo-code decoding device are flexible, is an important feature of such embodiments. As a matter of fact, a flexible turbo-code encoding device is a device having a configuration (a software and/or a hardware configuration) capable, once implemented, to correctly process the input data, in accordance with the interleaving pattern which is different depending on the size of the processed block or sub-block of data, and regardless of the size, i.e., regardless of the content of the interleaving pattern, i.e., for example the content of interleaving tables.

A flexible turbo-code decoding device is also a device having a configuration (software and/or hardware configuration) capable, once implemented, to correctly process and distributes during each iteration, the data outputted from the processing means of the turbo-code decoder, in accordance with the interleaving and/or deinterleaving patterns which are different depending on the size of the processed block or sub-block of data, and regardless of the size, i.e., regardless of the content of the interleaving and deinterleaving tables.

This is more particularly important for a turbo-code decoding device that can be implemented in a terminal of a wireless communication system, such as a mobile phone, especially when such turbo-code decoding device is partly hardware implemented.

This is even more particularly important when the turbo-code decoding means comprise several producers which output at each cycle of a clock signal several data to be correctly distributed at each iteration to the corresponding producers in accordance with interleaving and/or de-interleaving patterns.

Thus, according to a particular embodiment of the invention, the flexible turbo-code decoding means comprises a source memory means partitioned in N elementary source memories for storing a sequence of input data, processing means clocked by a clock signal and having N outputs for producing per cycle of the clock signal N data respectively associated to N input data respectively stored in the N elementary source memories at relative source addresses, N single port target memories, N interleaving tables containing for each relative source address the number of one target memory and the corresponding relative target address therein.

Further, the internal control means are adapted to modify the content of the interleaving tables in accordance with the size information. For example, depending on the size of the block of data, a particular interleaving pattern can be read from a memory which stores several patterns corresponding to several possible sizes, and stored in the interleaving tables.

To ensure the flexibility of the turbo-code decoding means, flexible turbo-code decoding means further comprises, for example, a flexible distributing structure connected to the processing means, the interleaving tables and the target memories. The flexible structure is arranged for distributing the outputted data to the corresponding target memories in accordance with the content of the interleaving tables regardless of the content of the interleaving tables.

Several approaches are possible to realize such a flexible distributing structure. According to a first approach, the flexible distributing structure comprises N cells, each cell being connected between the N outputs of the processing means, the N interleaving tables, and the port of one target memory. Each cell is adapted to receive data from the N outputs of the processing means, to select up to N received data in accordance with the contents of said interleaving tables, and to write the selected data sequentially in the associated target memory.

According to another approach, the flexible distributing structure comprises N cells connected in a ring structure. Each cell is further connected between one output of the processing means, one interleaving table, and the port of one target memory. Each cell is adapted to receive data from the output of the processing means and from its two neighboring cells, and to dispatch at least some of the received data to at least one of the two neighboring cells or to write at least some of these received data sequentially in the associated target memory, in accordance with the contents of the interleaving tables.

Another approach for controlling the turbo-code decoding latency comprises modifying the number of iterations associated to the turbo-code decoding operations. More precisely, the internal control means of the turbo-code decoding device are adapted to modify the number of iterations performed by the processing means of the turbo-code decoding means, in accordance with a desired turbo-code decoding latency.

According to another aspect, a wireless communication system is provided, in particular of the WPAN or WLAN type, comprising at least an apparatus as defined above.

BRIEF DESCRIPTION OF THE DRAWINGS

Other advantages and features of the invention will appear on examining the detailed description of embodiments, these being in no way limiting and of the appended drawings in which.

DETAILED DESCRIPTION OF THE PREFERRED EMBODIMENTS

Figure 1:
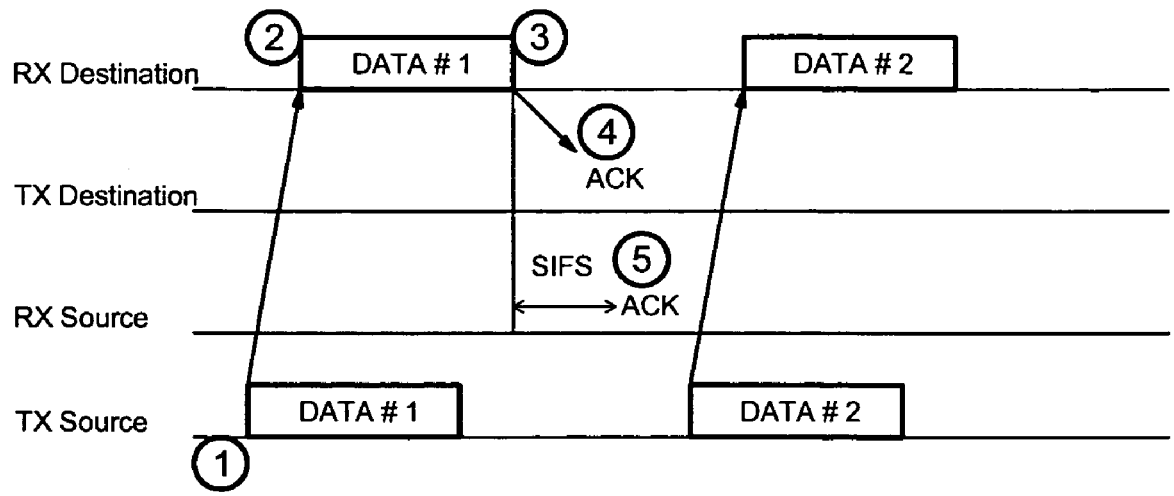
FIG. 1 illustrates a typical situation in an 802.11 type protocol based on a CSMA/CA multiple access method according to the prior art.
Figure 2:
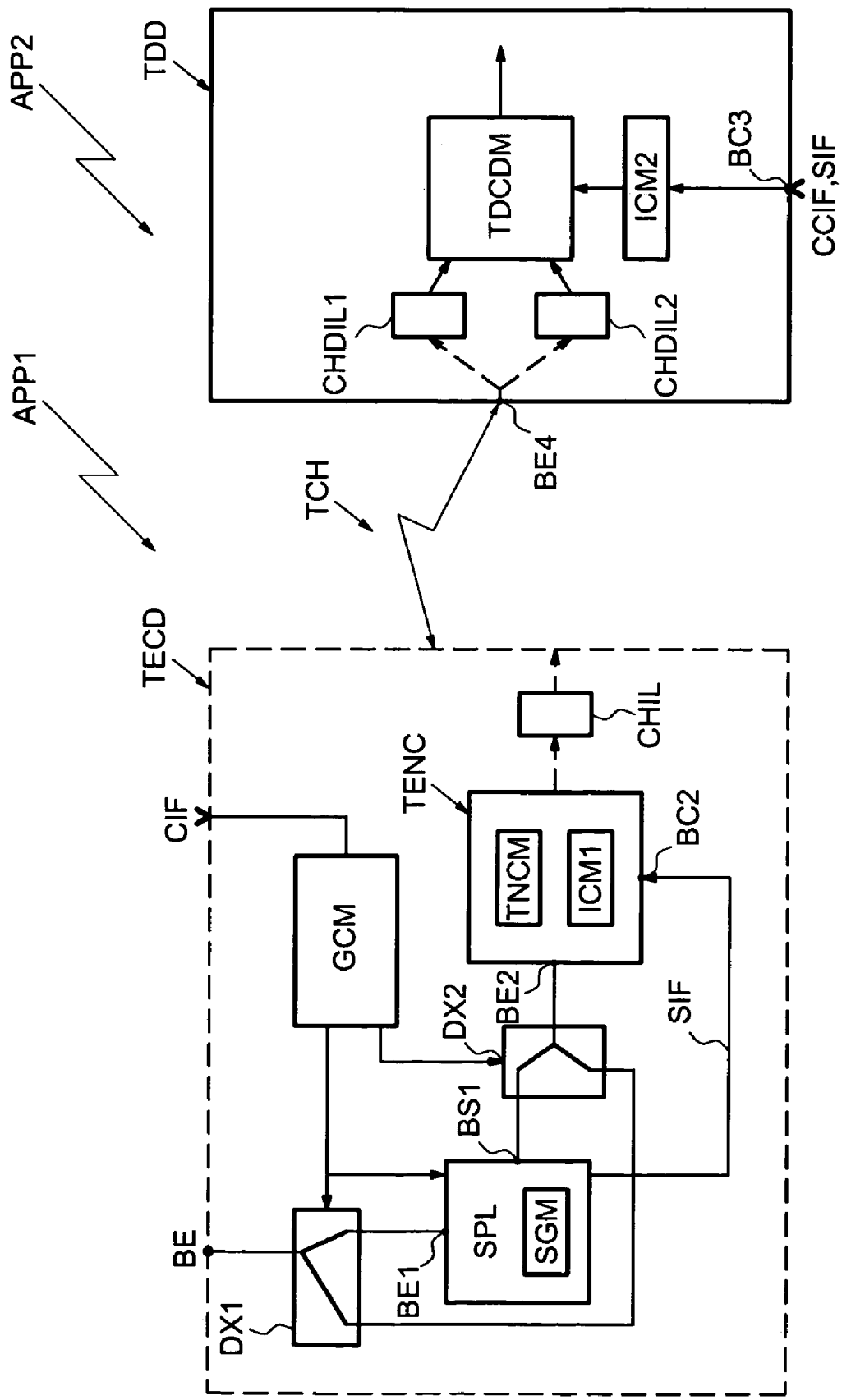
FIG. 2 illustrates diagrammatically an embodiment of an apparatus according to the invention.

In FIG. 2, APP1 refers to an apparatus according to an embodiment of the invention for turbo-code encoding blocks of data, and APP2 refers to an apparatus according to an embodiment of the invention for turbo-code decoding blocks of data.

The apparatuses APP1 and APP2 respectively comprise a flexible turbo-code encoding device TECD and a flexible turbo-code decoding device TDD. Both apparatuses communicate through a transmission channel TCH and can be, for example, incorporated respectively in two terminals belonging to a wireless communication system of the WPAN type or WLAN type.

The turbo-code encoding device TECD comprises a main input BE for receiving a block of data to be encoded, and a splitter SPL having a splitter input BE1, segmentation means SGM for splitting a block of data into a set of sub-blocks each having a chosen sub-block size, and a splitter output BS1 for sequentially delivering said sub-blocks.

The architecture of such a splitter is conventional and the splitter may be, for example, realized by software. The splitter input BE1 is connected to the main input BE by a multiplexer DX1, controlled by global control means GCM. The splitter output BS1 is connected to a first input of a second multiplexer DX2.

The second input of the multiplexer DX2 is directly connected to the other output of the multiplexer DX1. The second multiplexer DX2 is also controlled by the global control means GCM. The output of the second multiplexer DX2 is connected to a turbo-encoder data input BE2 of a turbo-encoder TENC.

The turbo-encoder TENC further comprises flexible turbo-code encoding means TNCM, a turbo-encoder control input BC2 for receiving information SIF representative of the size of the block or sub-block of data to be encoded.

The turbo-encoder TENC further comprises internal control means connected between the control input BC2 and the flexible turbo-code encoding means for adapting the turbo-code encoding means TNCM to the size information SIF. Before transmitting the encoded blocks or sub-blocks of data on the transmission channel TCH, a channel interleaving processing may be generally performed by a channel interleaver CHIL.

Figure 3:
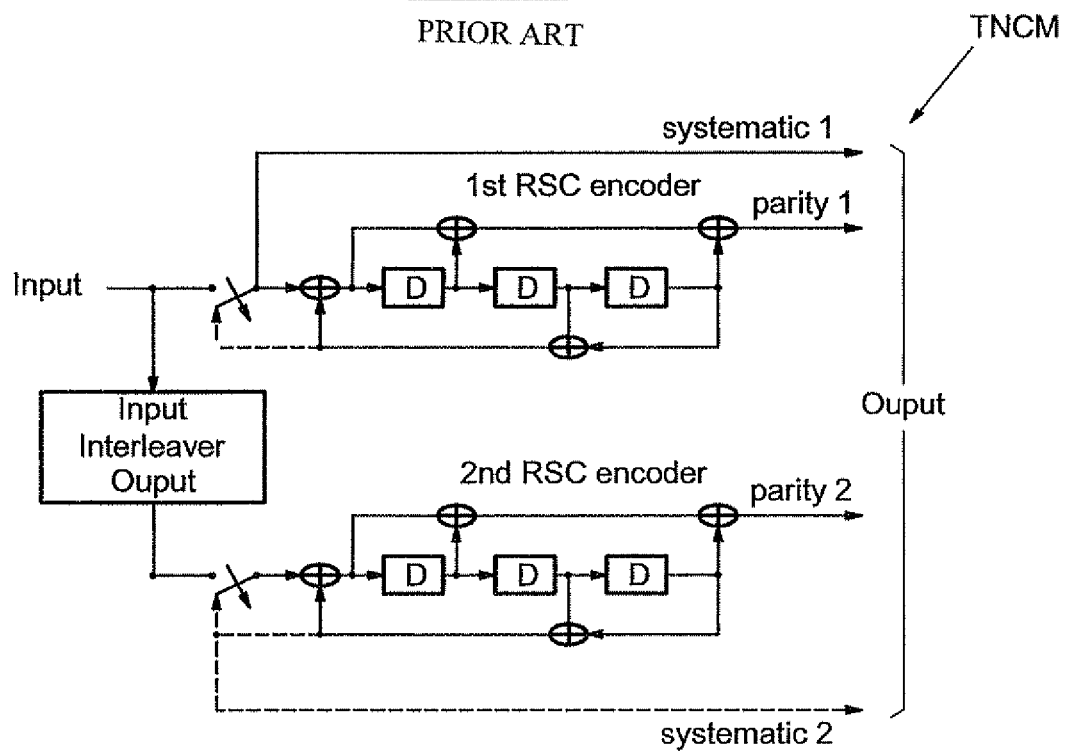
FIG. 3 shows an example of a flexible turbo-code encoder according to the prior art.

FIG. 3 shows an example of turbo-code encoding means TNCM. The turbo-code encoding means TNCM comprises two constituent convolutional encoders and an interleaver. The convolutional encoders are fixed to be RSC (Recursive Systematic Convolutional) encoders of rate ½.

In Turbo-code encoders forward error correction is enabled by introducing parity bits. For Turbo-codes, the original information, denoted as systematic information, is transmitted together with the parity information. The first RSC encoder works on the block of information in its original, the second one in an interleaved sequence.

The systematic information of the second encoder is not transmitted because it can be reconstructed by de-interleaving from the systematic output of the first encoder. By this a rate of R=⅓ is achieved.

Depending on the size of the block of data to be encoded, the interleaving pattern of the interleaver is different. For example, a memory can store different sets of interleaving patterns respectively associated to different sizes of block of data. Depending on the size of the block of data to be encoded, the corresponding set will be extracted from the memory to be stored in the interleaving table of the interleaver. The turbo-code encoding means are thus flexible.

The flexible turbo-code decoding device TDD comprises an input BE4 for receiving encoded blocks of data, flexible turbo-code decoding means TDCDM, a control input BC3 receiving (for example, from the MAP layer) a control information CCIF indicating whether or not the received block of data is nonequally split into a set of sub-blocks, and an information SIF (also for example from the MAP layer) representative of the size of the encoded block or sub-block of data received at the input BE4, and internal control means ICM2 for adapting the turbo-code decoding means TDCM to the size information.

Before being turbo-code decoded, the received blocks or sub-blocks of data are channel deinterleaved into channel deinterleaving means. In this embodiment, the channel deinterleaving means comprise two memories CHDIL1 and CHDIL2 working in a ping-pong manner. More precisely, whereas one block or sub-block of data is written in the interleaved form in one memory, the previously received block or sub-block of data, which has been written in the other memory, is read from this other memory in an order such that it is deinterleaved. Then, the block or sub-block written in the other memory is read by the turbo-code decoding means TDCDM whereas the following block or sub-block is written in the other memory.

As explained above, a turbo-code encoder comprises 2 RSC encoders. On the receiver side, there is a corresponding component decoder for each of them. Each component decoder implements for example a Maximum-A-Posteriori (MAP) Algorithm, and is usually a Soft-in-Soft-out (SISO) decoder.

Each block of information is decoded in an iterative manner. The systematic information and the parity information serve as inputs of the first component decoder (MAP1). The soft-output of MAP1 reflects its confidence on the received bits of being sent either as '0' or '1'. These confidences are interleaved in the same manner as in the encoder and passed to the second component decoder (MAP2) as a-priori information. The second component decoder uses this information to bias its estimation comprising the interleaved systematic information and the parity information of the second encoder. The soft-outputs are again passed on to MAP1, and so on. The exchange continues until stop criteria is fulfilled. Stop criteria range from simple cases, such as "fixed number of iterations", over cyclic redundancy check (CRC) to rather complex statistical analysis.

Implementation issues for Turbo-decoder architectures using the MAP algorithm have already been discussed in several papers and are well known [A. Worm. *Implementation Issues of Turbo-Decoders*. Phd thesis, Institute of Microelectronic Systems, Department of Electrical engineering and Information Technology, University of Kaiserslautern, Forschungsberichte Mikroelektronik, Bd.3, Germany, 2001].

The MAP algorithm is transformed into the logarithmic domain to reduce operator strength [P. Robertson, E. Villebrun and P. Hoeher: *A comparison of Optimal and Sub-Optimal MAP decoding Algorithms Operating in the Log-Domain*; Proc. 1995 International Conference on Communications (ICC '95), June 1995, Seattle, Wash., USA]: multiplications become additions, and additions are replaced by a modified comparison. It includes a forward recursion, a backward recursion and soft-output calculation.

Decoding Turbo codes by searching the most likely codeword is far too complex. Therefore, iterative decoding is advised. The two convolutional codes are decoded separately. While doing this, each decoder incorporates information that has been gathered by the other. This "gathering of information" is the exchange of soft-output values, where the bit-estimates of one unit are transformed into a priori information for the next. The decoders hence have to be soft-input soft-output (SISO) units.

The confidence in the bit estimation is represented as a Log-Likelihood-Ratio (LLR):

$$\Lambda(d_k) = \ln \frac{P(d_k = 1)}{P(d_k = 0)}$$

The sign shows whether this bit is supposed to be one or zero whereas the confidence in the decision is represented by the magnitude.

In order to extract the information that has been gathered during the last decoding stage, the systematic and a priori information that lead to this estimate have to be subtracted. This yields:

$$L^1(d_k) = \Lambda^1(d_k) - y_k^s - L^2_{deint}(d_k)$$

$$L^2(d_k) = \Lambda^2(d_k) - y_{kint}^s - L^1_{int}(d_k)$$

This is called the extrinsic information. The confidence of one decoder in a bit to have a certain value biases the initial guess of the other.

Figure 4:
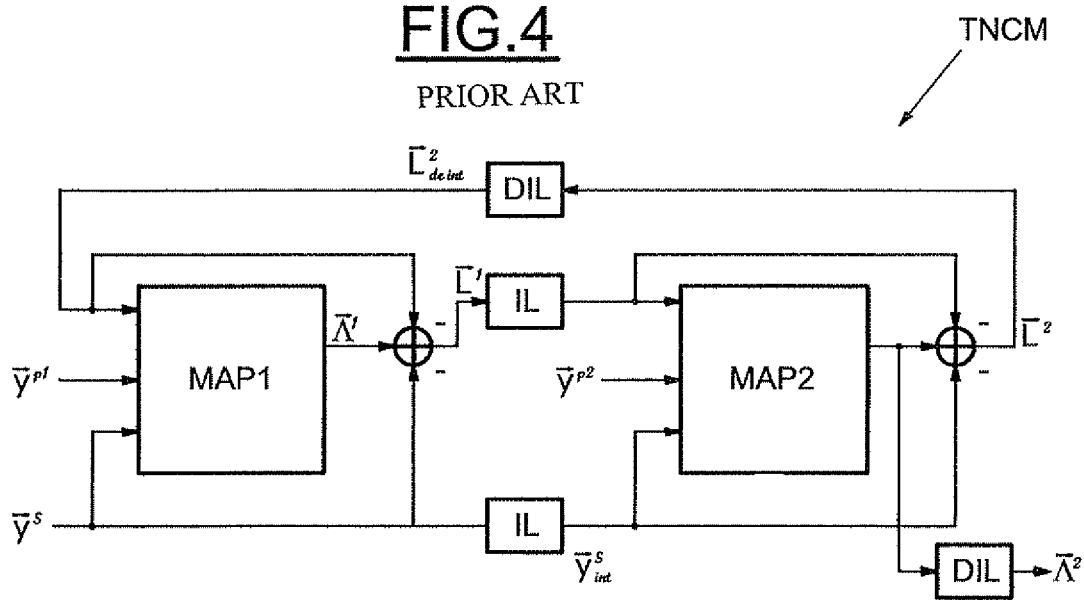
FIG. 4 shows an embodiment of a turbo-code decoder according to the prior art.

FIG. 4 shows turbo-code decoding means TDCDM comprising two MAP decoders, interleaving means IL and de-interleaving means DIL. Feeding the input of one decoder as a priori information input to the next enables the improvement over the decoding iterations. It also gave Turbo codes their name, as it resembles the "feedback-of-exhaust" used in combustion turbo engines. Inputs to the decoder are the received channel values (systematic, parity1 and parity2); during the very first MAP1 operation, the a priori information is set to zero.

In addition to the SISO decoders MAP1 and MAP2, memories are needed to store the input and output values, in particular for the interleaver and deinterleaver pattern. Of course, only one MAP unit can be used and therefore, the MAP1 and MAP2 operations are done serially on the same MAP unit.

For a given architecture of turbo-code decoding means TDCDM, the latency of the decoding process can be calculated. By adapting some parameters, different latencies can be reached based on the existing architecture. The parameters set can be divided in two main classes. One class is the fully adaptable parameters, which can be adapted during the operation of the turbo-code decoding means TDCDM. A second class is the implementation time adaptable parameters, which are the parameters that have to be fixed before the actual implementation of the turbo-code decoding means TDCDM.

The fully adaptable parameters are the number of iterations and the block size, whereas the implementation time adaptable parameter is the number of producers that is a number of data (LLR for example) which are produced per cycle of clock by a MAP unit. Thus, for a given number of producers and a given number of iterations, the block size of the block of data to be decoded sets the latency of the turbo-code decoding means.

Figure 5:
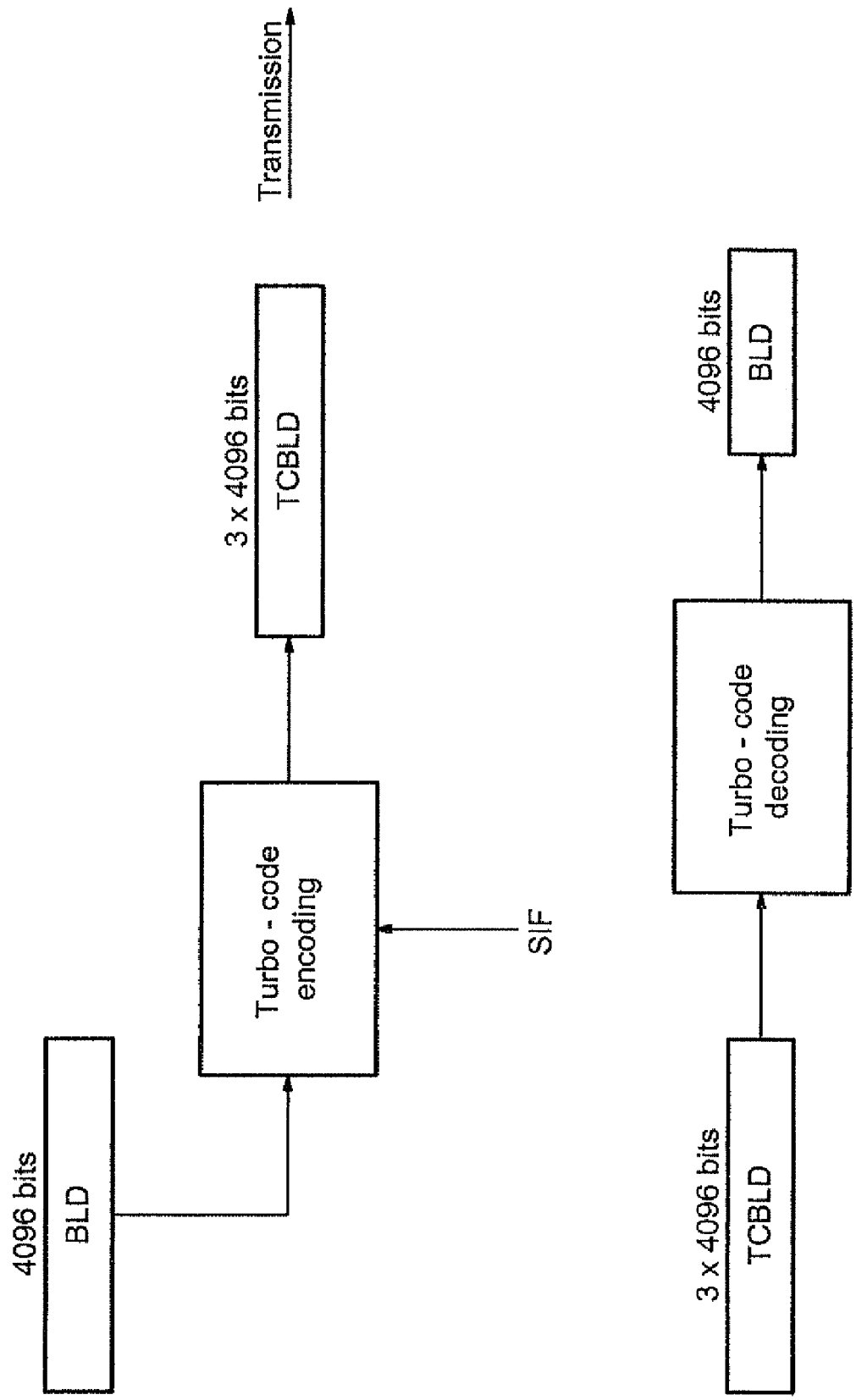
FIG. 5 illustrates diagrammatically a first example of processing a block of data according to the prior art.

Referring now again to FIG. 2, the global control means GCM receives from an upper layer (for example a MAC layer) a control information CIF related to a required decoding latency for a block of data received at the main input BE. If, for example, the control information CIF indicates that the received data are latency-non restricted data or if the block of data would lead to a decoding latency consistent with the indication given by the control information CIF, the global control means GCM will control the multiplexer DX1, DX2 in order to directly connect the input BE2 of the turbo-encoder TENC to the main input BE. The received block of data will be turbo-encoded without being split. An example of such a situation is given in FIG. 5 in which the received block of data BLD has a length of 4096 bits. Of course, the internal control means ICM1 have adapted the interleaving pattern to the size of the block of data (size information SIF).

Because of a coding rate of ⅓, the block of data BLD is encoded into a block of data TCBLD having a length of 3×4096 bits (=12288 bits). The turbo-encoded block of data TCBLD is then transmitted and received by the receiver in order to be turbo-decoded. The internal control means ICM2 of the turbo-code decoding device TDD adapt the interleaving and de-interleaving pattern to the size information SIF which is known from the turbo-code decoding device, for example from the MAP layer. The block TCBLD is then turbo-code decoded in order to retrieve the initial block of data BLD of 4096 bits.

However, if the control information CIF indicates that the size of block of data which is received at the main input BE would lead to a latency decoding which is greater than the required latency, the global control means will control the multiplexers DX1 and DX2 to connect the main input BE to the splitter input BE1 and to connect the splitter output BS1 to the input BE2 of the turbo-code encoder TENC.

Further, the global control means GCM control the splitter SPL in order to nonequally segment the block of data into a chosen number of sub-blocks. These sub-blocks will be sequentially and successively turbo-code encoded.

The last sub-block of the set to be encoded has a last sub-block size which is consistent with the desired turbo-code decoding latency. Generally speaking, at least another sub-block has the greatest sub-block size. The greatest sub-block size is consistent with a given turbo-code decoding speed.

Figure 6:
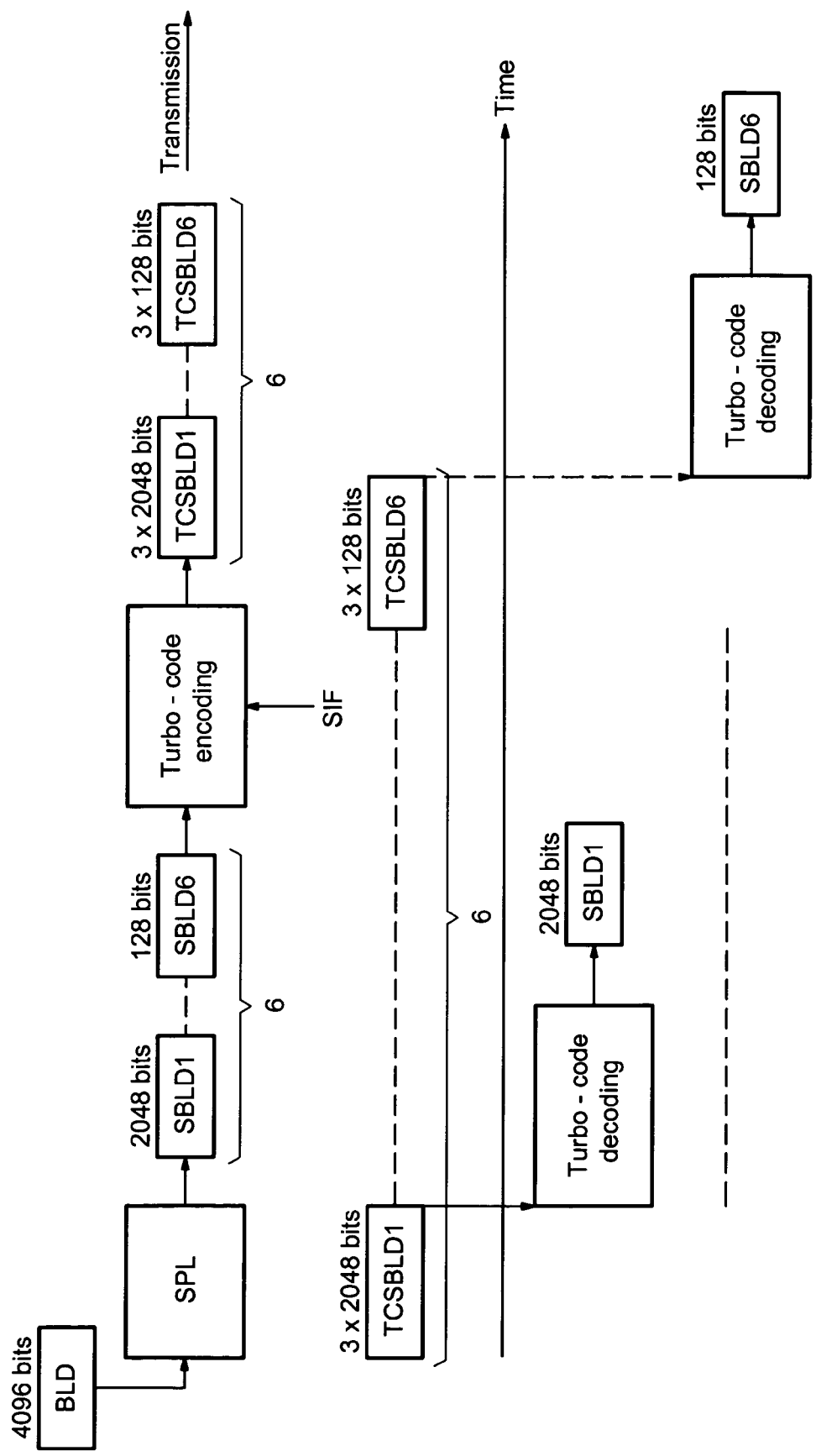
FIG. 6 illustrates diagrammatically another example of processing a block of data according to the invention.
Figure 7:
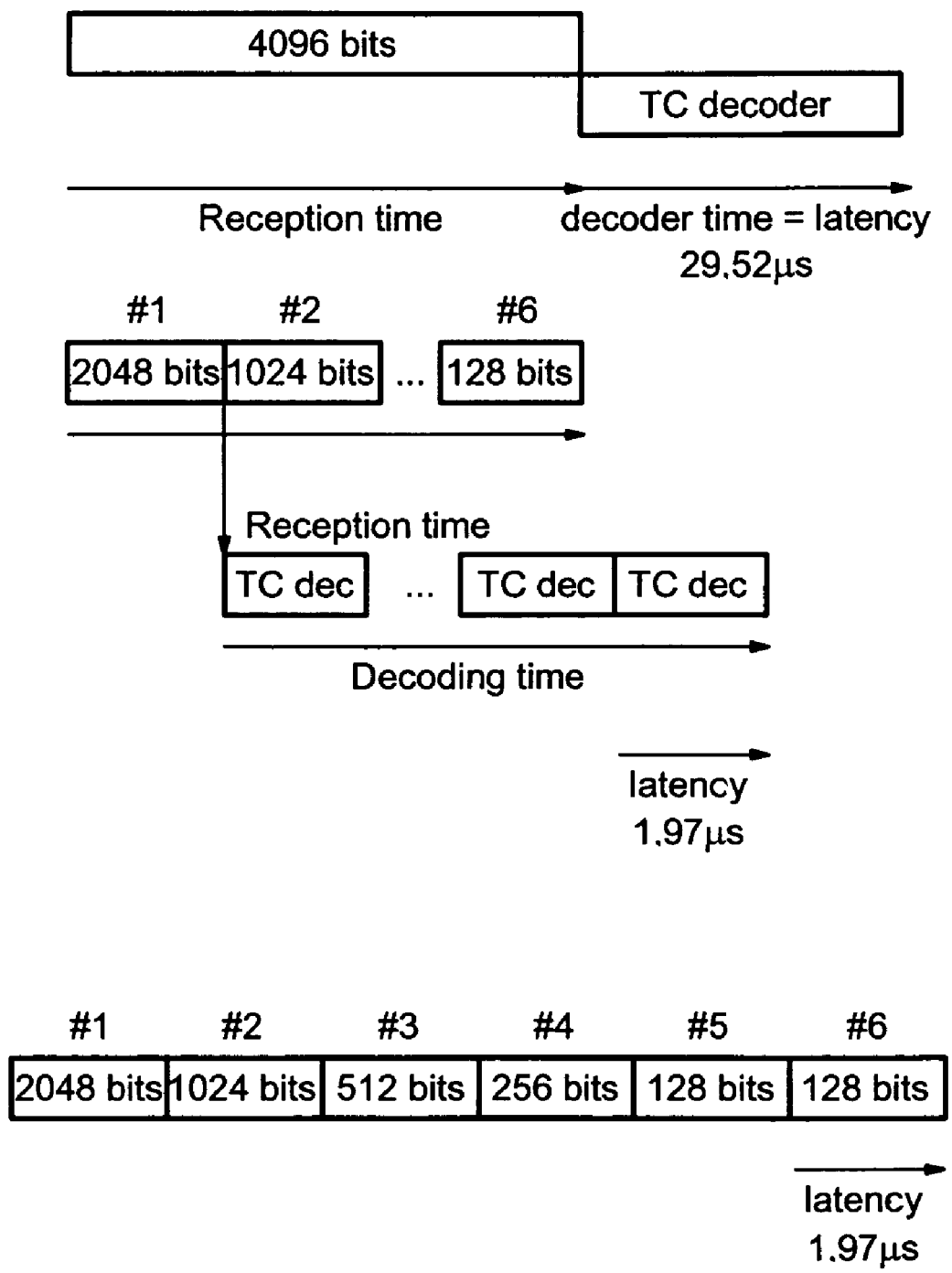
FIG. 7 illustrates a latency reduction through nonequal block segmentation according to the invention.

More precisely, an example of such a segmentation is illustrated in FIGS. 6 and 7. In this example, the received block data BLD, having a block size of 4096 bits, is split into six sub-blocks SBLD1-SBLD8. The first sub-block SBLD1 has a sub-block size of 2048 bits, and the sizes of the sub-blocks following this first sub-block decrease from the first sub-block SBLD1 to the last sub-block SBLD6 to be encoded.

In fact, in the present embodiment, this set of sub-blocks comprises a sub-set of sub-blocks SBLD1-SBLD5 in which the respective sizes of the sub-blocks decrease monotically from the first sub-block SBLD1 to the last sub-block SBLD5. The first sub-block of the sub-set has the greatest size (2048 bits) and the size of a current sub-block of the sub-set is a half of the size of the preceding sub-block of the sub-set. Thus, the last sub-block SBLD5 of the sub-set has a size of 128 bits.

Finally, the last sub-block SBLD6 of the set of sub-blocks has also a size of 128 bits. This size is consistent with a desired latency which in the present case equal to 1.97 microseconds.

The six sub-blocks SBTD1-SBLD6 are successively turbo-encoded and the turbo-encoder TENC delivers respectively and successively six encoded sub-blocks TCSBLD1-TCSBLD6. Each turbo-encoded sub-block TCSBLD1 has a length equal to 3 times the size of the corresponding sub-block SBLD1 (coding rate ⅓).

After transmission, the six encoded sub-blocks TSBLD1-TCSBLD6 are successively received. Each sub-block TCS-BLD1 is then turbo-decoded. The decoding process starts directly after the reception of the first sub-block TCSBLD1. Of course, for the decoding, the internal control means ICM2 have adapted the interleaving and de-interleaving pattern to the sub-block size.

Provided that the decoder can decode the block fast enough, so that at the end of the reception of sub-block n+1 (i.e., at the end of the writing sub-block n+1 in memory CHDIL1 for example), sub-block n (which was written in memory CHDIL2 for example) is decoded and the decoder is available (i.e., memory CHDIL2 is available for receiving sub-block n+2, while sub-block n+1 is had from memory CHDIL1). The latency is thus defined by the latency of the last sub-block decoding, as depicted in FIG. 7.

That is the reason why the greatest size of the sub-block of the set is chosen to be consistent with the given decoding speed of the decoder. This is done to avoid, for example, a conflict between the two ping-pong deinterleaving memories CHDIL1 and CHDIL2, or to avoid, a too complex management and read/write control of these two memories.

Figure 8:
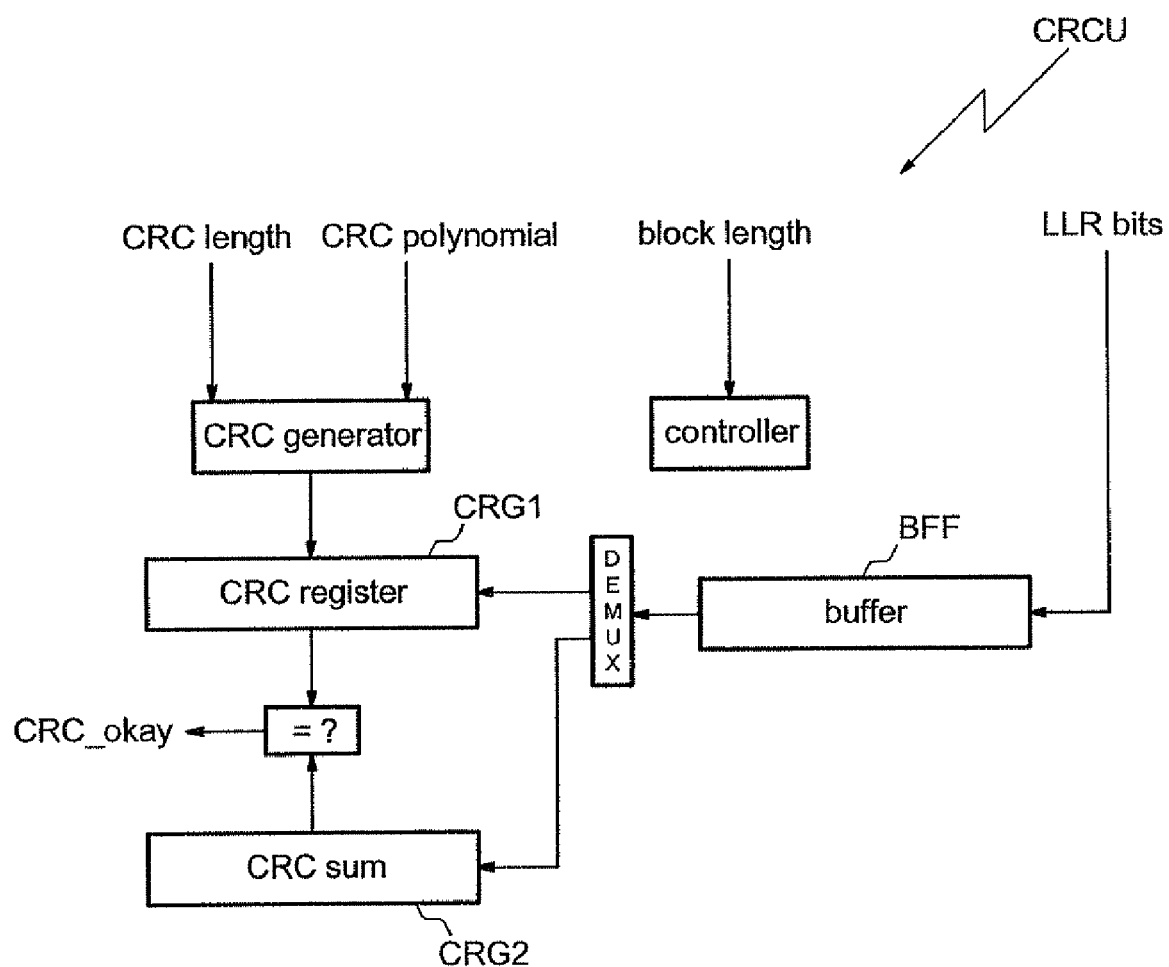
FIG. 8 illustrates CRC checking means according to the prior art.

Generally, each block of data received at the main input BE of the turbo-encoder TECD comprises at the end a CRC (Cyclic Redundancy Check) word. This CRC word, which is attached to the data block in reverse order during the encoding, is transmitted and received with the other encoded data by the receiver. The turbo-code decoding device also comprises a cyclic redundancy check unit CRCU (FIG. 8) for calculating from a received encoded block of data a calculated CRC word. Such a unit CRCU is well known by those skilled in the art. This CRC word is stored in a CRC register CRG1. Therefore, certain input parameters are necessary, which are the length of the CRC and the CRC polynominals.

The transmitted CRC word (which is called CRC sum) is stored in the register CRG2. Comparison means are adapted to compare the content of the register CRG1 with the register CRG2. When equal, the CRC check is positive.

When a block of data has been split before being turbo-encoded, the calculated CRC word is obtained from the decoding of all the sub-blocks resulting from the segmentation of the initial data block. In other words, the CRC register is written during the decoding of all the sub-blocks. The comparison with the CRC sum is made only after the decoding of the last sub-block.

Figure 9:
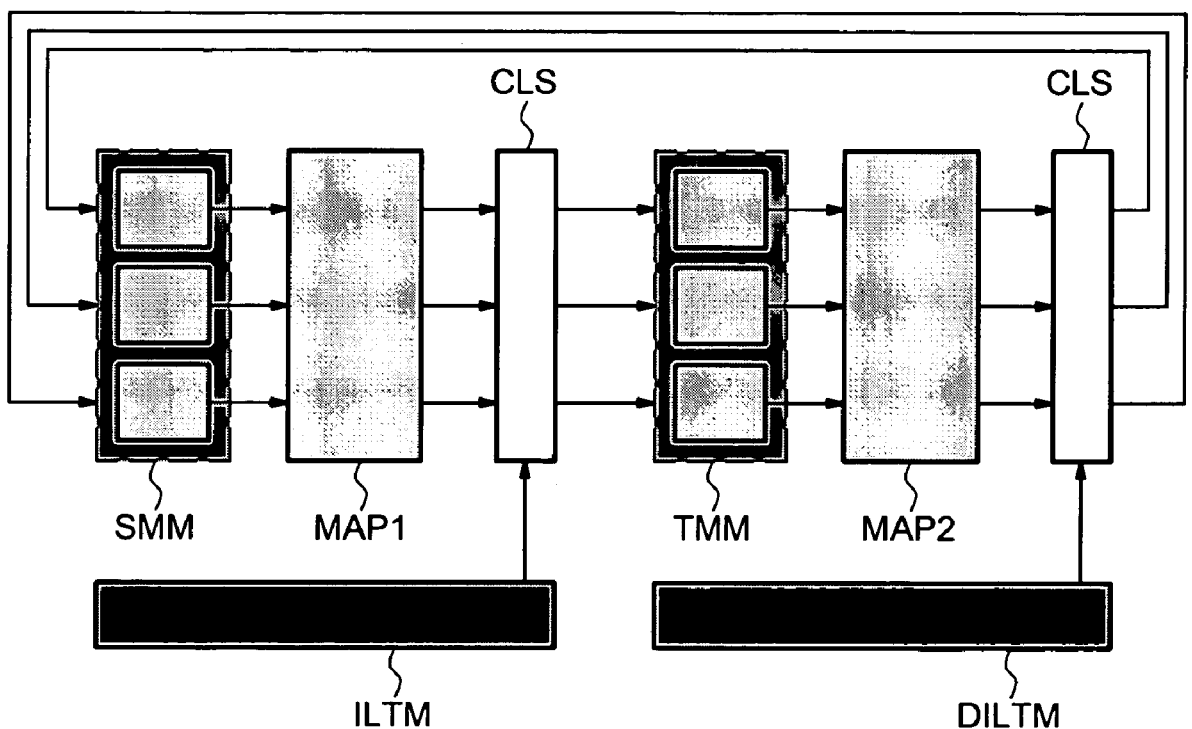
FIGS. 9-12 illustrate diagrammatically in greater detail a first embodiment of a flexible turbo-code decoding device according to the invention.

We will now refer to FIG. 9, which illustrate two variations of implementation of a flexible turbo-code decoding means TDCDM, which permit turbo-decode blocks of data or sub-blocks of data, regardless of the value of the block size or sub-block size. For further details concerning these two variations of implementation, one skilled in the art can refer to U.S. published patent application no. 2004/0052144A1.

In this example which illustrates a first variation of the invention, the MAP1 unit, as well as the MAP2 unit, is a multi-LLR producer which has N outputs (N=3) for producing, per cycle of the clock signal which clocks the MAP unit, N data (N LLR) respectively associated to N input data respectively stored in N elementary source memories which form source memory means SMM.

A structure CLS of N cells is connected to the N outputs of the MAP1 unit as well as to interleaving table means constituted by N interleaving tables. After having passed through the structure CLS, the N produced data (the N produced LLR) are stored in target memory means TMM constituted by N target memories.

Each of the source memory and the target memory is a single port memory. For the MAP2 unit, the target memory means TMM act as source memory means and the source memory means SMM of the MAP1 unit act as target memory means for the MAP2 unit. Further, the interleaving table means is replaced by deinterleaving table means DILTM.

Figure 10:
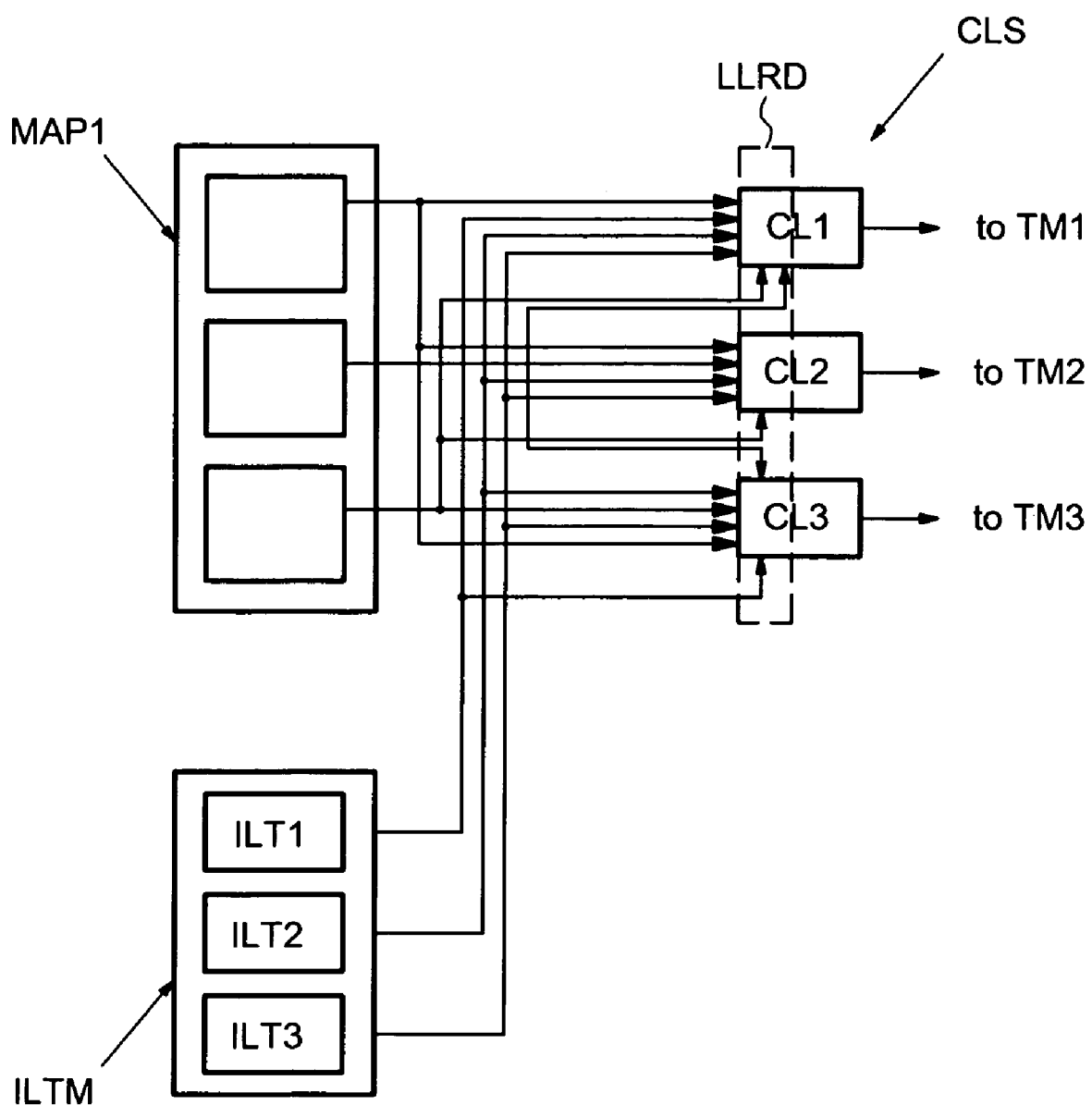
Figure 11:
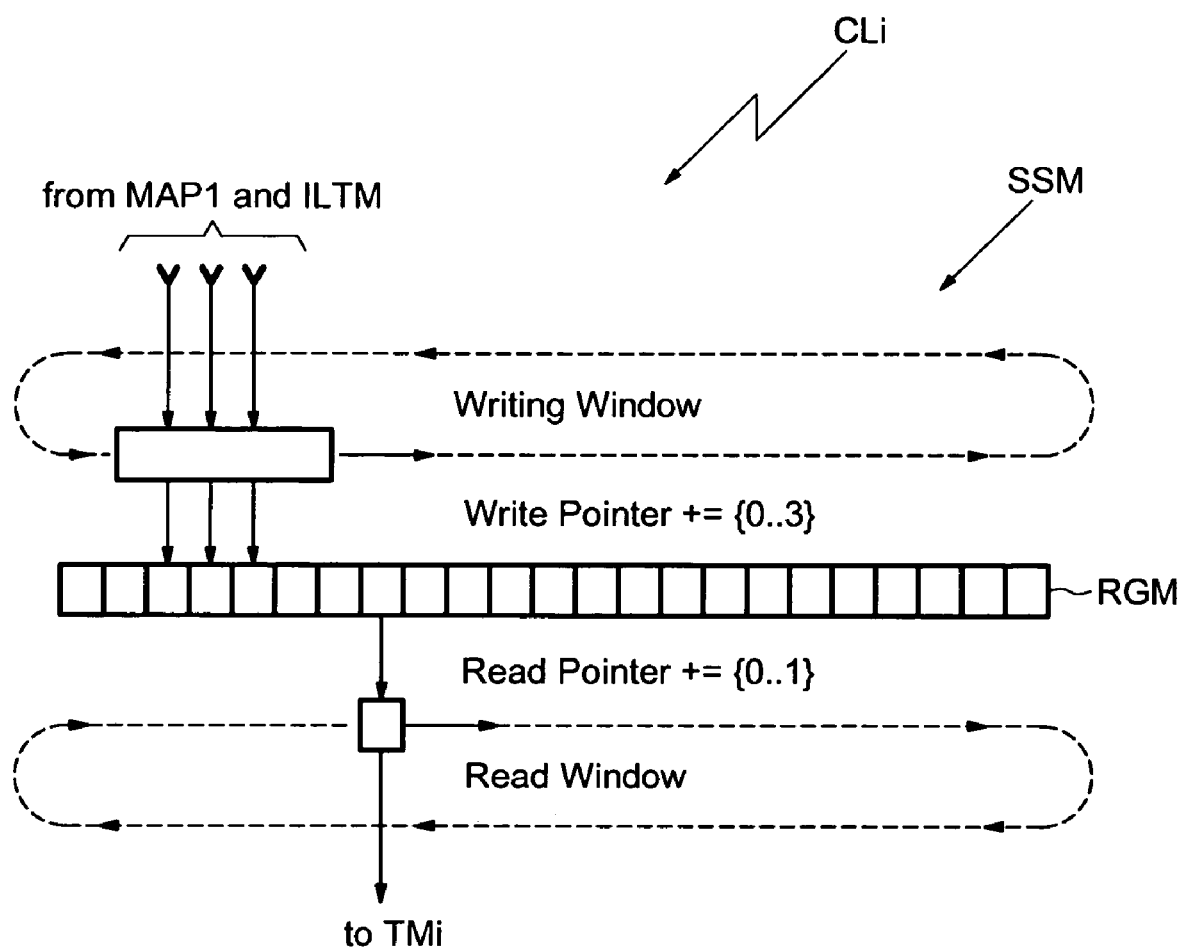
Figure 12:
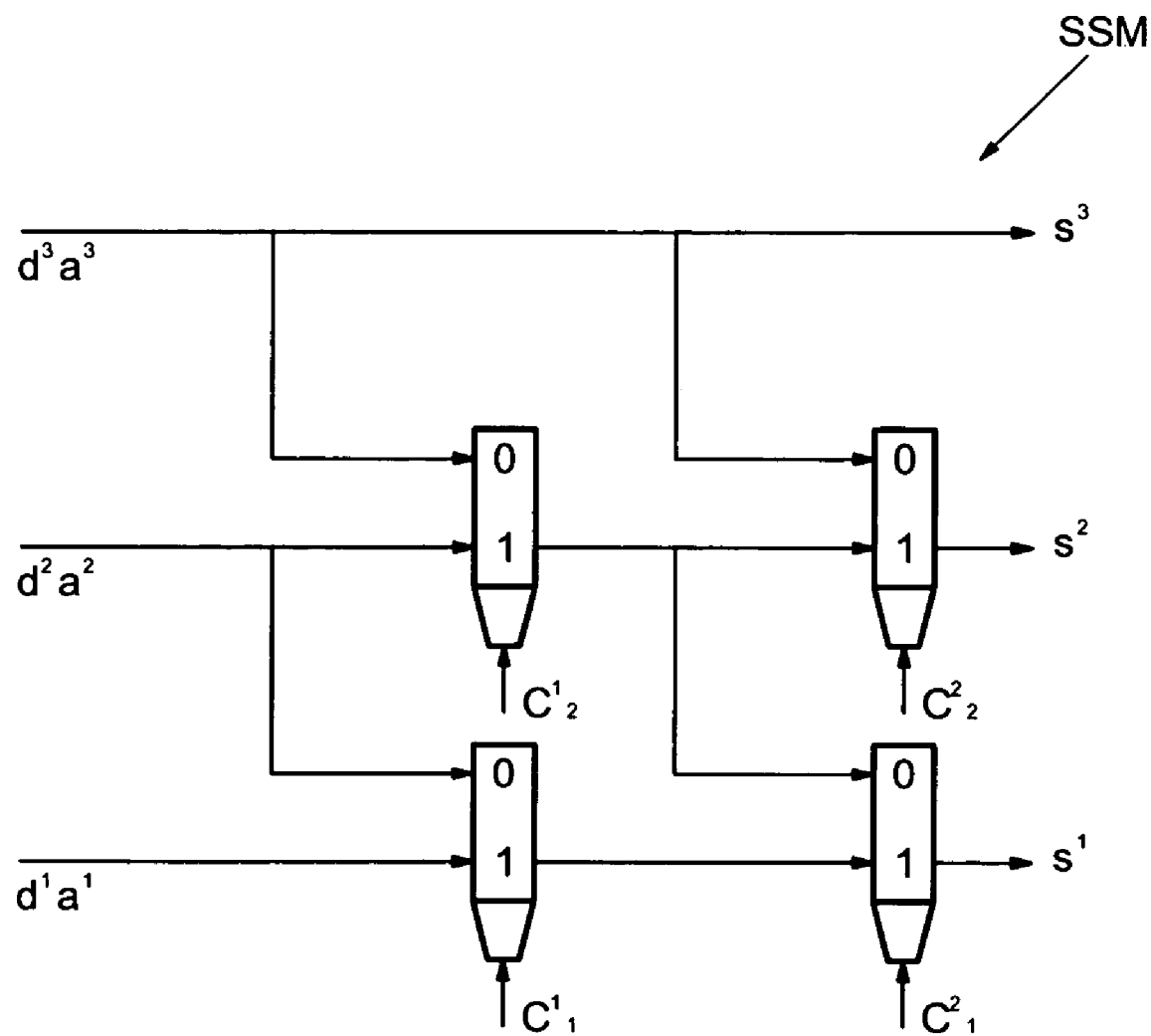

The structure and the operation of the turbo-code decoding means will be now described more in details in reference to FIGS. 10 to 12. Although the device is described by using interleaving table means, it is clear that the same concept applies to deinterleaving table means which can be in fact considered as being also in a certain way interleaving table means.

As illustrated in greater detail in FIG. 10, where N is equal to 3, each cell CLi of structure CLS is connected between the N outputs of the processing means MAP1, the N interleaving table ILTi and the port of one target memory TMi.

Generally speaking, each cell is adapted to receive data from the N outputs of the processing means, to select up to N received data in accordance with the contents of the interleaving tables, and to write the selected data sequentially in the associated target memory.

Each interleaver table ILTi comprises, for each relative source address of one source memory, the relative target address of a corresponding target memory as well as the number of this target memory. The number of the target memory and the corresponding relative target address therein constitute a target information associated to a data (LLR).

According to this first variation, each cell comprises sorting buffer means connected to the N outputs of the processing means, to the N interleaving tables and to the corresponding target memory. This is for receiving N data with their associated number of target memory and the associated relative target address, selecting from the N data those having an associated number of target memory identical to the number of the target memory connected to the cell, and delivering them sequentially to the target memory.

Of course it is possible that during one time-step the sorting buffer means of a cell does not select any data, and consequently does not deliver any data to the corresponding target memory.

As illustrated more particularly in FIG. 11, the sorting buffer means of a cell CLi comprises especially sorting means SMM, and register means RGM. As illustrated diagrammatically in FIG. 10, all the sorting means SMM of all the cells CLi form together a single LLR distributor referenced LLRD.

We refer now to FIGS. 11 and 12 to describe in greater detail one embodiment of a sorting buffer means of a cell CLi. Because in this example N is equal to three, three data are received in FIGS. 11 and 12 on the three inputs of the sorting buffer means. However, none of those or some of those or all the N data have to be stored in the local target RAM TMi, depending on their target information, and more particularly, on their associated number of target memory.

All these N data are received in the same clock cycle. However, only one data can be stored per cycle in the target RAM TMi. Thus, such a buffer must be able to store N values and output one value to memory in the same cycle.

Such a buffer does not need to support random access. It is implemented as a special register file capable of storing up to N values in parallel. A value is composed of a LLR-data with its associated target information, including the associated relative address.

Write and read accesses to a buffer can be modeled with writing windows where values can be stored in registers and reading windows. The writing window contains N registers, the worst case number of concurrent write accesses. Shifting it only by the number of values actually written prevents the creation of "holes" with irrelevant values.

FIG. 12 illustrates diagrammatically one embodiment of the sorting means SMM buffer still assuming that N is equal to 3. The sorting means comprises here two stages of two multiplexers 2:1 controlled by control signals $C_j^k$, When a control signal takes the value 1, the data which is received at the input 1 of the multiplexer is delivered at the output. By analogy, when a control signal takes the value 0, the data which is received at the input 0 is delivered at the output of the multiplexer.

The sorting means SSM are associated with the number of the target memory which is actually connected to the cell CLi. When a data arrives at the input of the sorting means SSM, its associated number of target memory is compared with the number of the target memory which is actually connected to the cell CLi. If these two numbers are identical, a decision variable $r^x$ is associated with the data and takes the value 1, for example. In the contrary, the decision variable $r^x$ takes the value 0.

Control means, realized by logic gates, generates then the control signals as mentioned thereafter:

$$C_1^1 = r^1$$
$$C_2^1 = r^1$$
$$C_1^2 = r^2 \text{ or } r^1$$
$$C_2^2 = r^2$$

Thus, from the inputs, only those which are relevant for this buffer are selected and aligned such that they form an uninterrupted sequence starting from s1 for example. These sorted sequence and the total number of relevant inputs (R) is passed to the register means RGM. The output $s^1$ to $s^R$ are stored in the register means RGM. This ensures a continuous filling of the register's means RGM of relevant data only.

When reading from the register means RGM, the local address a and the data d are separated again and are used to address the local target RAM accordingly.

Figure 13:
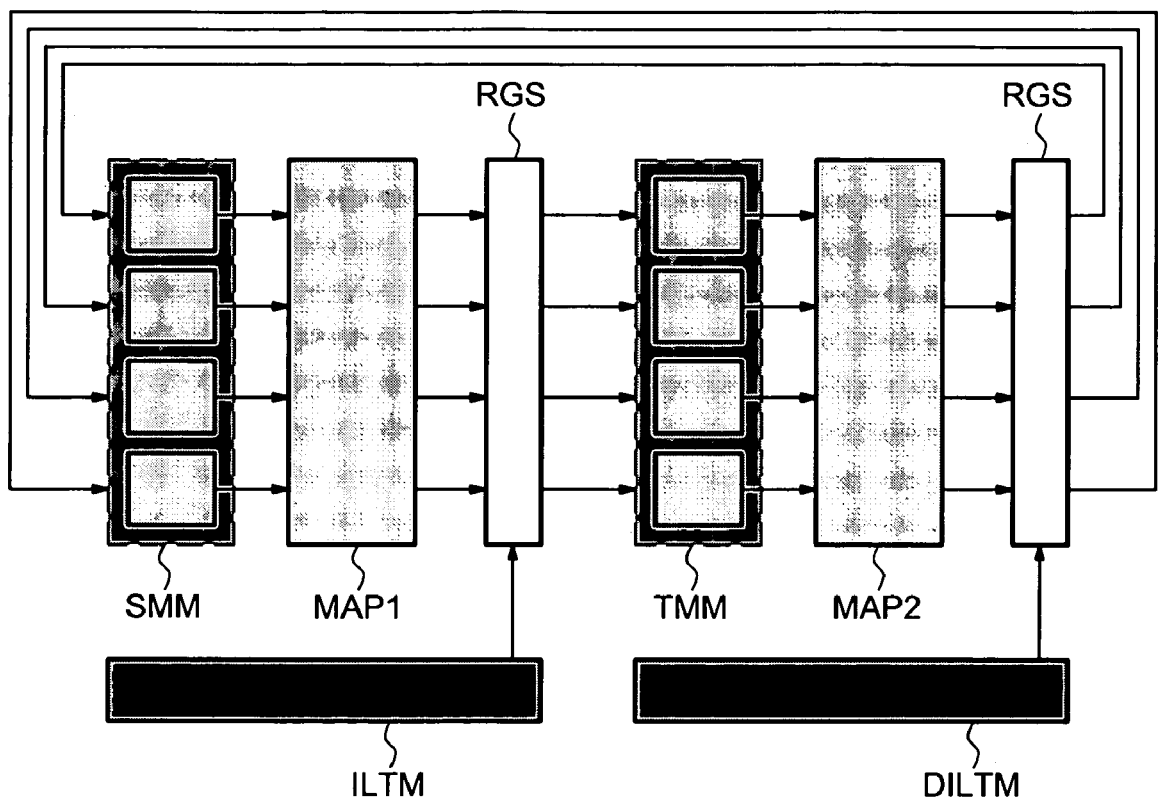
FIGS. 13-16 illustrate diagrammatically a second embodiment of a turbo-code decoding device according to the invention.

We refer now to FIGS. 13 to 16 for the description of a second variation of flexible turbo-code decoding means. Turning first to FIG. 13, the MAP1 unit, as well as the MAP2 unit, is a multi-LLR producer which has N outputs (here: N=4) for producing, per cycle of the clock signal which clocks the MAP unit, N data (here: N LLR) respectively associated to N input data respectively stored in N elementary source memories which form source memory means SMM.

N cells connected in a ring structure RGS are connected to the N output of the MAP1 unit as well as to interleaving table means constituted by N interleaving tables. After having passed through the ring structure RGS, the N produced data (the N produced LLR) are stored in target memory means TMM constituted by N target memories.

Each of the source memory and the target memory is a single port memory. For the MAP2 unit, the target memory means TMM act as source memory means and the source memory means SMM of the MAP1 unit act as target memory means for the MAP2 unit. Further, the interleaving table means is replaced by deinterleaving table means DILTM.

The structure and the operation of the turbo-code decoding means will be now described in greater detail in reference to the following FIGS. Further, as for the first variation, although the device is described now by using interleaving table means, it is clear that the same concept applies to deinterleaving table means which can be in fact considered as being also in a certain way interleaving table means.

Figure 14:
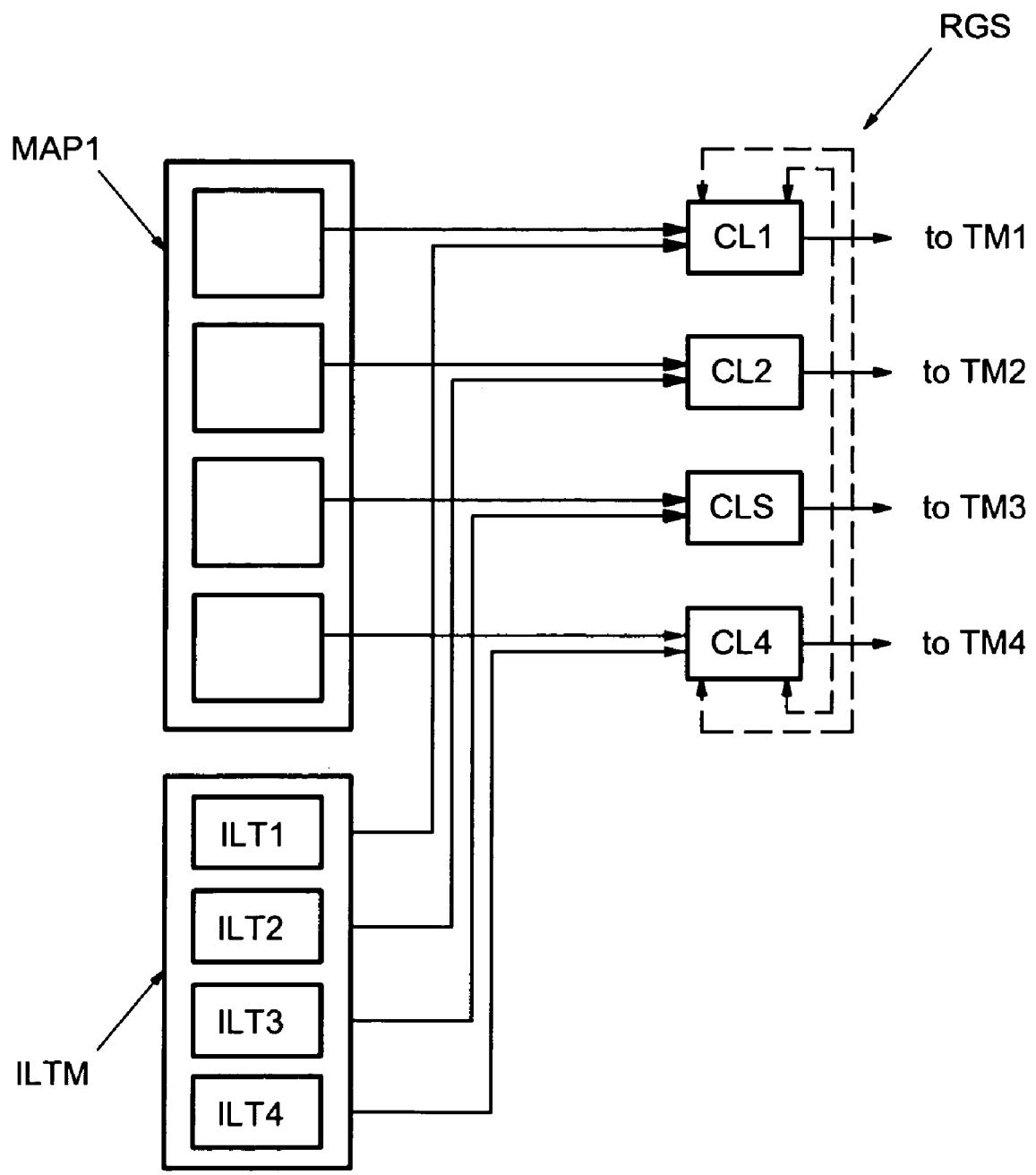

As illustrated in greater detail in FIG. 14, in which N is equal to 4, each cell CLi of the ring structure RGS is connected between one output of the processing means MAP1, one interleaving table ILTi and the port of one target memory TMi.

Generally speaking, all the cells are adapted to receive data from the respective outputs of the processing means and from their two respective neighboring cells, and to dispatch at least some of these received data to at least one of the two respective neighboring cells or to write respectively at least some of these received data sequentially in the associated target memories, in accordance with the contents of the interleaving tables.

Bach interleaver table ILTi comprises, for each relative source address of one source memory, the relative target address of a corresponding target memory as well as the number of this target memory. The number of the target memory and the corresponding relative target address therein constitute a target information associated to a data (LLR).

Figure 15:
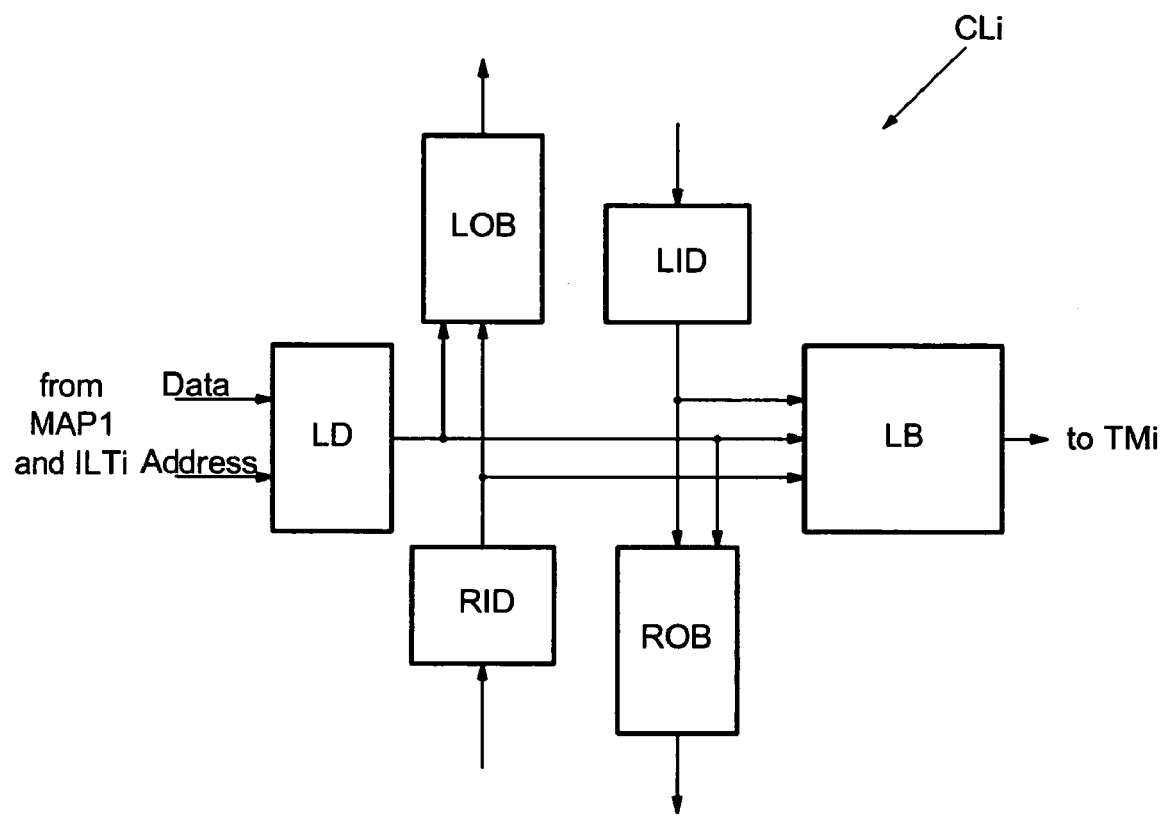

As illustrated more particularly in FIG. 15, a cell CLi comprises distribution means (LD) connected to a corresponding output of the processing means MAP1 and to the corresponding interleaving table, and also distribution means (RID, LID) connected to the two neighboring cells.

The distribution means are adapted to receive generated data respectively associated with their target information. The distribution means will then deliver the generated data associated with their target information together with corresponding direction information.

Further to the distribution means, each cell comprises also sorting buffer means LB, LOB, ROB, connected to the distribution means, but also to the corresponding target memory and to the two neighboring cells.

Generally speaking, sorting buffer means are adapted to receive the corresponding data associated with their target information and their corresponding direction information, to select from these data those which are to be actually passed through in accordance with the corresponding direction information, and delivering them sequentially.

Turning now again to the distribution means, it appears in FIG. 15 that the distribution means comprises a local distributor LD connected to the corresponding output of the processing means MAP1 and to the corresponding interleaving table. The local distributor receives a generated local data associated with its target information containing the corresponding number of the target memory and the corresponding relative target address therein.

This local distributor LD of the cell CLi has only to decide whether the incoming data is stored in the target RAM TMi connected to the cell CLi, or has to be sent left or right. The direction for non-local data is determined based on the shortest path to the target RAM.

The local distributor, which is formed for example by a logic circuit, delivers the received data with its target information and generates a direction information for this data. This direction information is for example a word of two bits. For example, the values (0,0) means "go ahead" to the target RAM TMi. The values (0,1) means "go left" whereas the values (1,0) means "go right".

A look-up table, not represented in FIG. 15, is associated with the cell and contains a mapping of the different values of the direction information and the numbers of the different cells (i.e., the numbers of the different target memories). When a data arrives, the local distributor LD compares the number of the corresponding target memory associated with this data with the content of the look-up table to generate a corresponding direction information.

Two additional distributors are necessary in each cell for the left and right inputs. More precisely, the distribution means of the cell CLi comprises a right-in distributor RID and a left-in distributor LID.

The right-in distributor is adapted to receive a right-in data delivered by the right neighboring cell associated also with a target information. The right-in distributor delivers the right-in data associated with its target information, together with a direction information. The direction information is also generated using the look-up table.

By analogy, the left-in distributor LID is adapted to receive a left-in data delivered by the left neighboring cell and for delivering the left-in data associated with its target information, together with a direction information.

As illustrated in FIG. 15, a data received by the local distributor LD can be stored in the local target memory TMi or be sent left or right. By analogy, a data received by the right-in distributor can be stored to the local target RAM THi or be sent to the left neighboring cell. A data received by the left-in distributor LID can be stored in the local RAM TMi or be sent to the right neighboring cell.

The sorting buffer means comprises a local out sorting buffer LB having three inputs respectively connected to the local, right-in and left-in distributors. The local out sorting buffer LOB has also one output connected to the port of the local target memory TMi.

The local out sorting buffer LD is adapted to receive the corresponding data associated with their target information and their corresponding direction information, selecting from these data those which are to be stored in the target memory TMi in accordance with the corresponding direction information, and for writing them sequentially in the target memory in accordance with their relative destination addresses.

In the present case, the local out buffer LB can receive 0, 1 2 or 3 data in one clock cycle, to be stored in the local target RAM. In other words, as several data sets may have the same target, the local buffer needs to be capable of storing more than one data per cycle and to deliver them sequentially one data per cycle. A specific architecture for such a buffer will be described more in details thereafter.

The left out sorting buffer LOB is adapted to receive the corresponding data associated with their target information and their direction information, to select for these data those which are to be delivered to the right-in distributor of the left neighboring cell in accordance with their direction information, and for delivering sequentially the selected data with their target information.

By analogy, the sorting buffer means comprises also a right-out sorting buffer ROB having two inputs respectively connected to the local and left-in distributor of the right neighboring cell. The right out sorting buffer ROB is adapted to receive the corresponding data associated with their target information and their direction information, selecting from these data those which are to be delivered to the left-in distributor of the right neighboring cell in accordance with their direction information, and to deliver sequentially the selected data with their target information.

Figure 16:
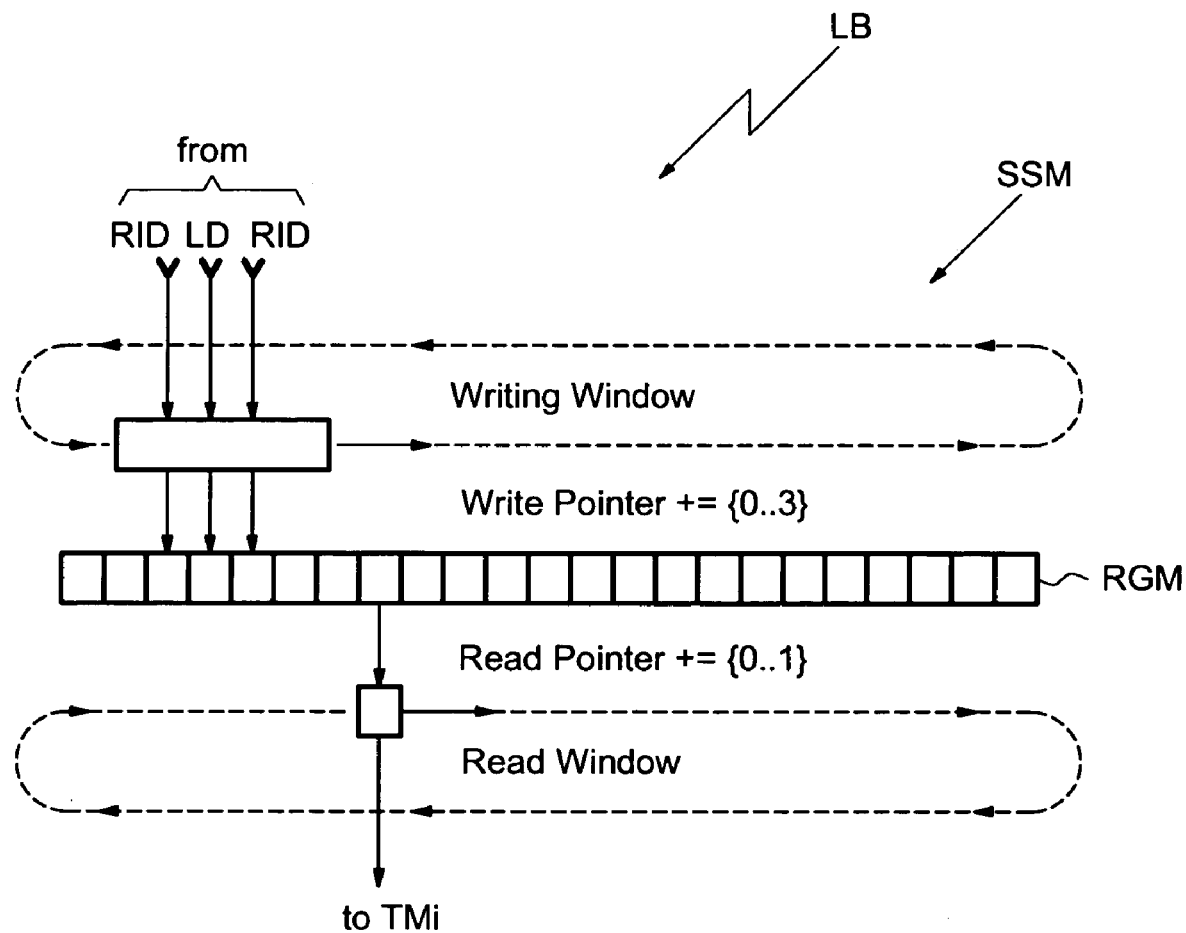

We refer now to FIGS. 16 and 6 to describe more in details one embodiment of the local out buffer LB.

As already explained, three data are received on the three inputs of the local out buffer LB. However, none of those or some of those or all the three data have to be stored in the local target RAM TMi, depending on their direction information.

All these three data are received in the same clock cycle. However, only one data can be stored per cycle in the target RAM TMi. Thus, such a buffer must be able to store three values and output one value to memory in the same cycle.

Such a buffer does not need to support random access. It is implemented as a special register file capable of storing up to three values in parallel. A value is composed of a LLR-data with its associated target information, including the associated relative address.

Write and read accesses to a buffer can be modeled with writing windows where values can be stored in registers and reading windows. The writing window contains three registers, the worst case number of concurrent write accesses. Shifting it only by the number of values actually written prevents the creation of "holes" with irrelevant values.

As for the first variation, FIG. 6 illustrates diagrammatically one embodiment of the sorting means SMM. The sorting means comprises two stages of two multiplexers 2:1 controlled by control signals $C_j^k$ When a control signal takes the value 1, the data which is received at the input 1 of the multiplexer is delivered at the output. By analogy, when a control signal takes the value 0, the data which is received at the input 0 is delivered at the output of the multiplexer.

The sorting means SSM are associated with a referenced direction information for this buffer, for example the referenced direction information (0,0) for the local out sorting buffer LB. When a data arrives at the input of the sorting means SSM, its direction information is compared with the referenced direction information. If these two direction information are identical, a decision variable $r^x$ is associated with the data and takes the value 1, for example. In the contrary, the decision variable $r^x$ takes the value 0.

Control means, realized by logic gates, generates the control signals as follows:

$$C_1^1 = r^1$$
$$C_2^1 = r^1$$
$$C_1^2 = r^2 \text{ or } r^1$$
$$C_2^2 = r^2$$

Thus, from the inputs, only those which are relevant for this buffer are selected and aligned such that they form an uninterrupted sequence starting from $s^1$ for example. These sorted sequences and the total number of relevant inputs (R) are passed to the register means. The output $s^1$ to $s^R$ are stored in the register means RGM. This ensures a continuous filling of the register's means RGM of relevant data only.

When reading from the register means RGM, the local address a and the data d are separated again and used to address the local target RAM accordingly.

Of course, an analogous architecture is used for the left out sorting buffer and the right out sorting buffer, with the differences that they have only two inputs instead of three.

The invention is not limited to turbo-code but can be applied more generally to blocks oriented code, as for example LDPC codes. Low-Density Parity-Check (LDPC) codes were introduced by Gallager in 1962 and rediscovered in 1996 by MacKay and Neal. LDPC codes are also described for example in U.S. published patent application no. 2003/0126551. For a long time they had no practical impact due to their computational and implementation complexity. This changed with advances in microelectronics that led to more computational power at hand for simulation and which now enables implementation. Due to their excellent error correction performance they are considered for future telecommunication standards.

An LDPC code is a linear block code defined by its sparse M×N parity check matrix H. It contains j ones per column and k ones per row, called row and column degree respectively. A (j,k)-regular LDPC code has row and column degree of uniform weight, otherwise the code is called irregular. A parity check code can be represented by a bipartite graph. The M check nodes correspond to the parity constraints, the N variable nodes represent the data symbols of the codeword. An edge in the graph corresponds to a one in the parity check matrix.

In the LDPC code encoder the packet to encode of size (N−M) is multiplied with a generator matrix G of size (N−M)×N. This multiplication leads to an encoded vector of length N. The generator matrix G and the parity check matrix H satisfy the relation $GH^t=0$ where 0 is the null matrix.

Figure 17:
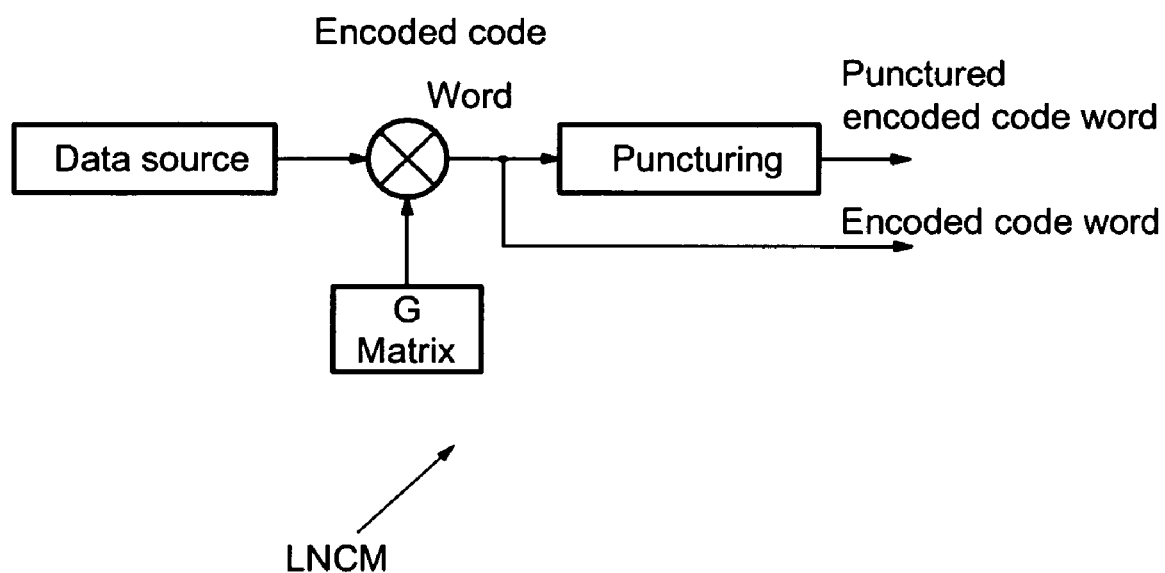
FIGS. 17-19 illustrate diagrammatically another embodiment of the invention more particularly directed to an LDPC code.

An example of such a structure of an LDPC code encoding means LNCM is illustrated in FIG. 17. The LDPC encoder incorporating these encoding means LNCM may include a puncturing unit, depending on the system in which this encoder is incorporated (ARQ system with or without incremental redundancy, for example).

Figure 18:
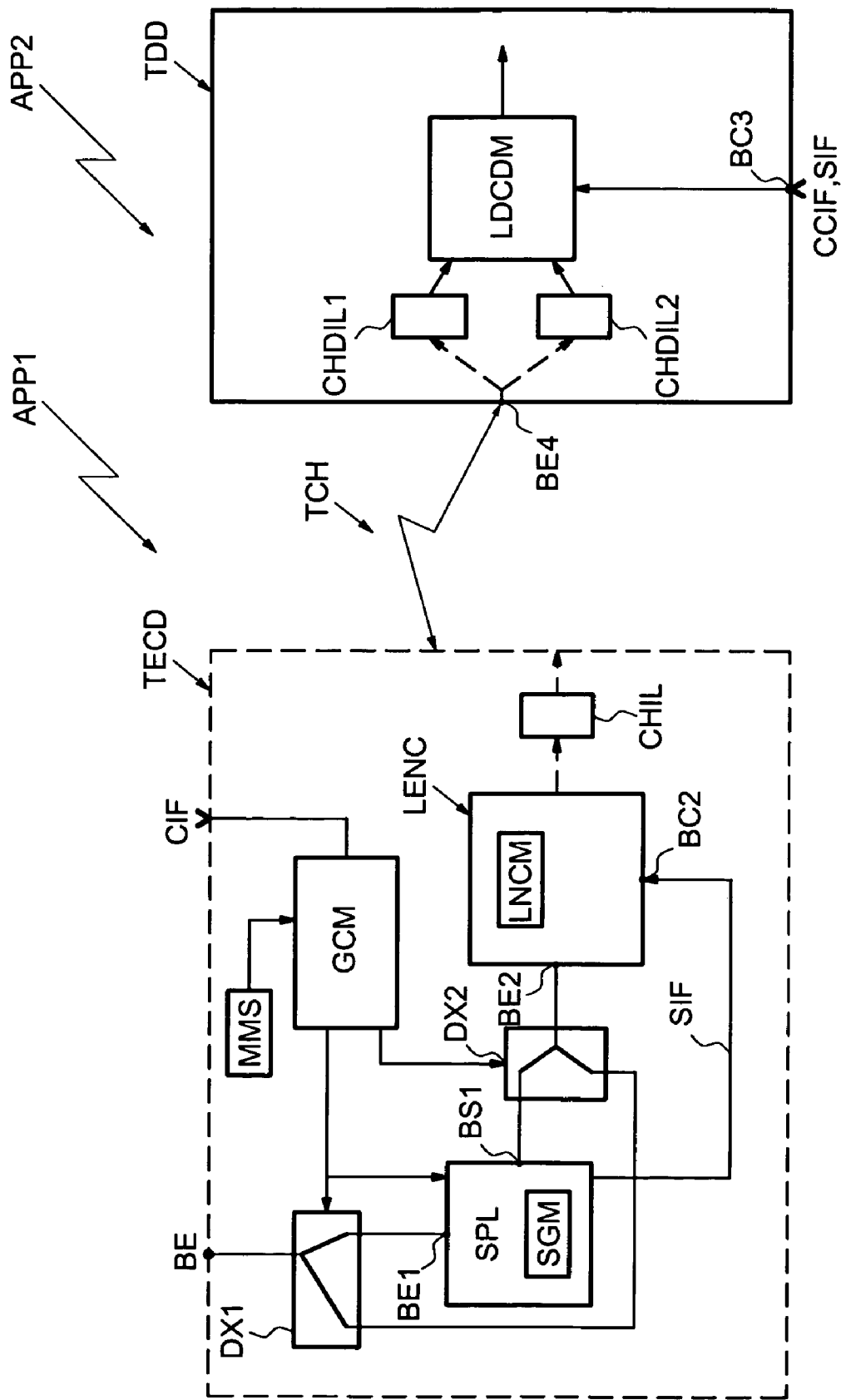

FIG. 18 illustrates an encoding device TECD including an LDPC encoder LENC. Only the differences between FIGS. 2 and 18 will now be described. The encoding device TECD further comprises a memory containing a set of predefined sizes consistent with the architecture of the LDPC encoder.

If, for example, the control information CIF indicates that the received data are latency-nonrestricted data or if the block of data would lead to a decoding latency consistent with the indication given by the control information CIF. The global control means GCM will control the multiplexer DX1, DX2 in order to directly connect the input BE2 of the LDPC encoder LENC to the main input BE. The received block of data will be encoded without being split taking into account the size information SIF.

However, if the control information CIF indicates that the size of block of data which is received at the main input BE would lead to a latency decoding which is greater than the required latency, the global control means will control the multiplexers DX1 and DX2 to connect the main input BE to the splitter input BE1 and to connect the splitter output BS1 to the input BE2 of the LDPC code encoder LENC.

Further, the global control means GCM control the splitter SPL in order to nonequally segment the block of data into a chosen number of sub-blocks. These sub-blocks will be sequentially and successively turbo-code encoded. With this respect the global control means will choose the sizes of the sub-blocks in the set of sizes contained in the memory MMS, and in particular the size of the last sub-block which will lead to a decoding latency equal to the desired latency, if possible, or the closest to the desired decoding latency, if not possible.

The LDPC code encoded block of data or the encoded sub-blocks are then transmitted and received by the receiver in order to be decoded. Generally speaking an LDPC code decoder comprises a decoding module which receives the encoded vector of length N and delivers an intermediate vector of length N by using the parity check matrix H. Then a de-mapping module extracts from the intermediate vector the decoded vector of length (N−M).

Figure 19:
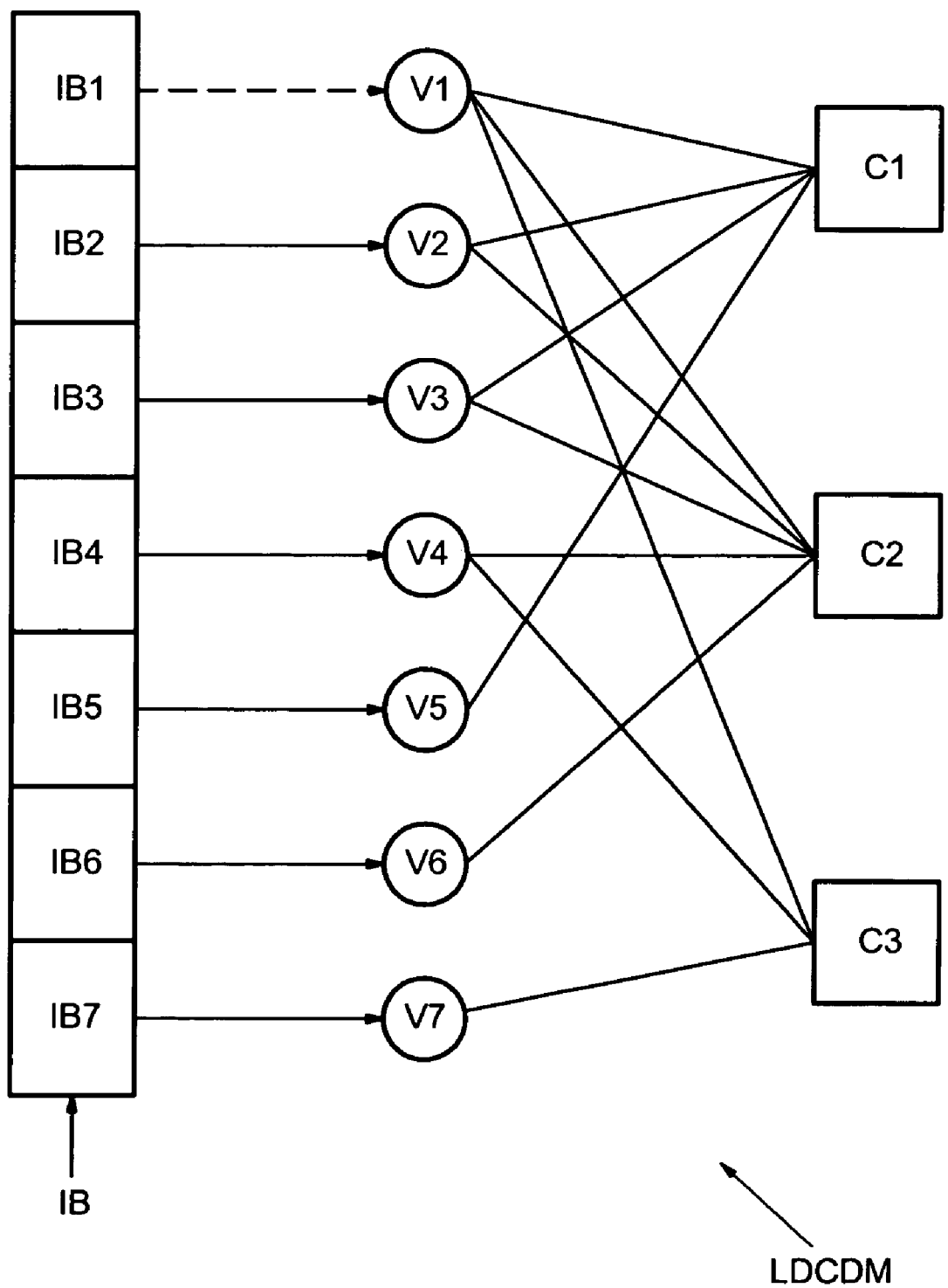

The basic structure of an LDPC code decoder based on message passing concept includes variable nodes and check nodes. An example of such a structure referenced LDCDM is depicted in FIG. 19.

In this FIG., the references V1 to V7 represent the variable nodes connected to the input buffer IB of the decoder, and the references C1 to C3 are the check nodes. In a real implementation, both variable and check nodes can be seen as processing units with dedicated memory elements.

More precisely LDPC codes can be decoded using message passing algorithms, either in hard or soft decision form. The decoding is then an iterative process, which exchanges messages between variable and check nodes. Typically a Belief Propagation (BP) algorithm can be used, which exchanges soft-information iteratively between variable and check nodes. The code performance mainly depends on the randomness of the parity check matrix, the codeword size N and the code rate R=(N−M)/N.

Many publications describe LDPC decoders and the decoding algorithm implemented therein. An example of such a publication is "VLSI Implementation-Oriented (3,k)-Regular Low-Density Parity-Check Codes", Tong Zhang and Keshab K. Parhi, IEEE Workshop on Signal Processing Systems (SiPS), September 2001.

The LDPC decoding means LDCDM, incorporated in the decoding device TDD, are adapted to decode the received block or sub-blocks of data, depending on the value of the information CCIF and taking into account the size information SIF.

Of course all what has been detailed concerning the CRC calculation and verification for the turbo-code is also true for the blocks oriented codes in particular the LDPC code.

That which is claimed:

1. A method of encoding a block of data using an apparatus comprising a main input, a splitter comprising a splitter input and a splitter output, a block oriented code encoder comprising an encoder data input, an encoder coupled to the encoder input, and an encoder control input, and a global controller, the method comprising:

receiving at the main input of the apparatus the block of data to be encoded;

operating the splitter to split the block of data into a set of sub-blocks in which a last sub-block to be encoded has a last sub-block size consistent with a decoding latency equal to or being the closest to a desired decoding latency and at least another sub-block has a greatest sub-block size, the greatest sub-block size being consistent with a given decoding speed, and the splitter output adapted to sequentially deliver the sub-blocks;

receiving at the encoder control input of the encoder information representative of a size of the block of data to be encoded; and operating the global controller based on received control information to either couple the splitter input to the main input and the encoder data input to the splitter output, or couple the encoder data input to the main input.

2. A method according to claim 1, wherein the sizes of the sub-blocks decrease from a first sub-block to be encoded to the last sub-block to be encoded.

3. A method according to claim 2, wherein the set-of sub-blocks comprise a sub-set of sub-blocks in which the respective sizes of the sub-blocks decrease monotonically from the first sub-block of the sub-set to be encoded to the last sub-block of the sub-set to be encoded, the first sub-block of the sub-set having the greatest size, and the size of a current sub-block of the sub-set is half the size of a preceding sub-block of the sub-set.

4. A method according to claim 1, wherein a block oriented code comprises a turbo-code; and further comprising:
    adapting an interleaving pattern associated to the turbo-code encoding to the size of the block of data if the size of the block is consistent with a desired turbo-code decoding latency; and
    respectively adapting the interleaving pattern associated to the turbo-code encoding to the size of the successive sub-blocks if the size of the block of data is not consistent with the desired turbo-code decoding latency.

5. A method according to claim 1, wherein the block oriented code comprises a Low-Density Parity-Check (LDPC) code.

6. A method according to claim 1, wherein the sizes of the sub-blocks are chosen within a set of predefined sizes.

7. A method according to claim 1, wherein the encoded block of data is transmitted from at least one of a wireless data communication system and a digital subscriber line system.

8. A method of decoding a received encoded block of data using a block oriented code encoder comprising an encoder data input, an encoder coupled to the encoder input, and an encoder control input, the method comprising:
    receiving at the encoder input the encoded block of data to be decoded;
    receiving at the encoder control input control information indicating whether or not the received encoded block of data comprises a sequence of encoded sub-blocks in which a last sub-block to be decoded has a sub-block size consistent with a decoding latency equal to or being the closest to a desired decoding latency, and at least another sub-block having a greatest sub-block size; and
    operating the encoder depending on the control information to decode the block of data as a whole, or sequentially and successively decode the encoded sub-blocks, the decoding of each encoded sub-block beginning at an end of reception of the encoded sub-block.

9. A method according to claim 8, wherein a block oriented code comprises a turbo-code; and further comprising depending on the control information, turbo-code decoding the block of data as a whole while adapting the interleaving and de-interleaving pattern associated to the turbo-code decoding to a size of the received block, or sequentially and successively turbo-code decoding the encoded sub-blocks while respectively adapting the interleaving and de-interleaving pattern associated to the turbo-code decoding to a size of the successive sub-blocks.

10. A method according to claim 8, further comprising adapting the number of iterations performed during the turbo-code decoding.

11. A method according to claim 8, wherein the block oriented code comprises a Low-Density Parity-Check (LDPC) code.

12. A method according to claim 8, further comprising:
    calculating a CRC word from the data decoded in all the sub-blocks; and
    comparing the calculated CRC word with an initial CRC word after having decoded a last encoded sub-block, an initial CRC word being included in the corresponding block of data before it has been encoded.

13. A method according to claim 8, wherein the encoded block of data is received from a wireless data communication system comprising at least one of a WPAN, a WLAN, an UMTS mobile radio system.

14. A method according to claim 8, wherein the encoded block of data is received from a digital subscriber line system comprising at least one of ADSL and VDSL.

15. An apparatus comprising:
    a main input adapted to receive a block of data to be encoded;
    a splitter comprising a splitter input and a splitter output, and being adapted to split the block of data into a set of sub-blocks in which a last sub-block to be encoded has a last sub-block size consistent with a decoding latency equal to or being the closest to a desired decoding latency and at least another sub-block has a greatest sub-block size, the greatest sub-block size being consistent with a given decoding speed, and said splitter output adapted to sequentially deliver the sub-blocks;
    a block oriented code encoder comprising an encoder data input, an encoder coupled to said encoder input, and an encoder control input adapted to receive information representative of a size of the block of data to be encoded; and
    a global controller adapted to receive control information and to either couple said splitter input to said main input and said encoder data input to said splitter output, or couple said encoder data input to said main input, depending on the control information.

16. An apparatus according to claim 15, wherein the sizes of the sub-blocks decrease from a first sub-block to be encoded to the last sub-block to be encoded.

17. An apparatus according to claim 16, wherein the set of sub-blocks comprises a sub-set of sub-blocks in which the respective sizes of the sub-blocks decrease monotonically from a first sub-block of the sub-set to be encoded to the last sub-block of the sub-set to be encoded, the first sub-block of the sub-set having the greatest size, and the size of a current sub-block of the sub-set is half the size of a preceding sub-block of the sub-set.

18. An apparatus according to claim 15, wherein the block oriented code comprises a turbo code and said encoder comprises a flexible turbo-code encoder; and wherein said block oriented code encoder further comprises an internal controller for adapting said turbo-code encoder to size information.

19. An apparatus according to claim 15, wherein the block oriented code comprises a Low-Density Parity-Check (LDPC) code.

20. An apparatus according to claim 15, wherein the sizes of the sub-blocks belong to a set of predefined sizes.

21. An apparatus to claim 15, wherein said main input, said splitter, said block oriented code encoder and said global controller are configured so that the apparatus operates in at least one of a wireless data communication system and a digital subscriber line system.

22. An apparatus comprising:
    an input for receiving encoded blocks of data;
    a decoder coupled to said input;
    a control input adapted to receive control information indicating whether or not the received block of data is nonequally split into a set of sub-blocks, and information representative of a size of the encoded block of data or of the size of each sub-block of the set; and said decoder being adapted, depending on the control information, to decode the block of data as a whole, or sequentially and successively decode the encoded sub-blocks, the decoding of each encoded sub-block beginning at an end of reception of the encoded sub-block.

23. An apparatus according to claim 22, wherein the block oriented code comprises a Low-Density Parity-Check (LDPC) code.

24. An apparatus according to claim 22, wherein the block oriented code comprises a turbo code, and further comprising a flexible turbo-code decoding device having an adaptable latency, and wherein said decoder comprises flexible turbo-code decoder, and said flexible turbo-code decoding device further comprising an internal controller for adapting said turbo-code decoder to size information.

25. An apparatus according to claim 24, wherein said flexible turbo-code decoder comprises:

a source memory partitioned into N elementary source memories for storing a sequence of input data, where N is greater than 1;

a processor clocked by a clock signal and having N outputs for producing per cycle of the clock signal N data respectively associated to N input data respectively stored in said N elementary source memories at relative source addresses;

N single port target memories;

N interleaving tables containing for each relative source address the number of one target memory and the corresponding relative target address therein;

said internal controller being adapted to modify the content of the interleaving tables in accordance with size information; and said flexible turbo-code decoder further comprising a flexible distributing structure connected to said processor, said N interleaving tables and said N target memories, said flexible distributing structure being arranged for distributing the data output to said corresponding target memories in accordance with the content of said interleaving tables regardless of their content.

26. An apparatus according to claim 25, wherein said flexible distributing structure comprises N cells, each cell being connected between the N outputs of said processor, said N interleaving tables, and the port of one target memory, each cell being adapted to receive data from said N outputs of said processor, to select up to N received data in accordance with the contents of said interleaving tables, and to write the selected data sequentially in the associated target memory.

27. An apparatus according to claim 26, wherein said turbo-code decoder comprises a processor for performing operations iteratively, and said internal controller is adapted to modify the number of iterations in accordance with a desired turbo-code decoding latency.

28. An apparatus according to claim 25, wherein said flexible distributing structure comprises N cells connected in a ring structure, each cell being further connected between one output of said processor, one interleaving table, and the port of one target memory, each cell being adapted to receive data from said output of said processor and from its two neighboring cells, and to dispatch at least a portion of the received data to at least one of the two neighboring cells or to write at least a portion of the received data sequentially in the associated target memory, in accordance with the contents of said interleaving tables.

29. An apparatus to claim 22, wherein said input, said decoder and said control input are configured so that the apparatus operates in at least one of a wireless data communication system and a digital subscriber line system.

* * * * *

UNITED STATES PATENT AND TRADEMARK OFFICE
CERTIFICATE OF CORRECTION

| | | |
|---|---|---|
| PATENT NO. | : 7,836,376 B2 | |
| APPLICATION NO. | : 11/559632 | |
| DATED | : November 16, 2010 | |
| INVENTOR(S) | : Berens | |

It is certified that error appears in the above-identified patent and that said Letters Patent is hereby corrected as shown below:

Column 2, Line 51    Delete: "receiving a control"
    Insert: --receiving control--

Column 3, Line 19    Delete: "are"
    Insert: --is--

Column 3, Line 28    Delete: "LUPC"
    Insert: --LDPC--

Column 5, Line 20    Delete: "a n d"
    Insert: --and--

Column 5, Line 32    Delete: "comprise"
    Insert: --comprises--

Column 5, Line 48    Delete: "distributes"
    Insert: --distribute--

Column 8, Line 17    Delete: "block"
    Insert: --blocks--

Column 10, Line 64    Delete: "SBLD1-SBLD8"
    Insert: --SBLD1-SBLD6--

Column 11, Line 16    Delete: "TCSBLD1"
    Insert: --TCSBLDi--

Column 11, Line 18    Delete: "SBLD1"
    Insert: --SBLDi--

Signed and Sealed this
Nineteenth Day of July, 2011

David J. Kappos
*Director of the United States Patent and Trademark Office*

CERTIFICATE OF CORRECTION (continued)
U.S. Pat. No. 7,836,376 B2

Column 11, Line 19  Delete: "TSBLD1"
                    Insert: --TCSBLD1--

Column 11, Line 21  Delete: "BLD1"
                    Insert: --BLDi--

Column 11, Line 64  Delete: "illustrate"
                    Insert: --illustrates--

Column 13, Line 31  Delete: "When a data"
                    Insert: --When data--

Column 13, Line 52  Delete: "These"
                    Insert: --This--

Column 13, Line 53  Delete: "is"
                    Insert: --are--

Column 13, Line 54  Delete: "output"
                    Insert: --outputs--

Column 14, Line 34  Delete: "Bach"
                    Insert: --Each--

Column 15, Line 17  Delete: "When a data"
                    Insert: --When data--

Column 15, Line 38  Delete: "THi"
                    Insert: --TMi--

Column 15, Line 47  Delete: "LD"
                    Insert: --LB--

Column 15, Line 54  Delete: "1"
                    Insert: --1,--

Column 16, Line 36  Delete: "$C_j^k$"
                    Insert: --$C_j^k$.--